United States Patent
Cleavelin et al.

(10) Patent No.: US 8,941,094 B2
(45) Date of Patent: Jan. 27, 2015

(54) METHODS FOR ADJUSTING THE CONDUCTIVITY RANGE OF A NANOTUBE FABRIC LAYER

(75) Inventors: C. Rinn Cleavelin, Dallas, TX (US); Thomas Rueckes, Rockport, MA (US); H. Montgomery Manning, Eagle, ID (US); Darlene Hamilton, Lacey, WA (US); Feng Gu, Westford, MA (US)

(73) Assignee: Nantero Inc., Woburn, MA (US)

( * ) Notice: Subject to any disclaimer, the term of this patent is extended or adjusted under 35 U.S.C. 154(b) by 525 days.

(21) Appl. No.: 12/874,501

(22) Filed: Sep. 2, 2010

(65) Prior Publication Data
US 2012/0056149 A1 Mar. 8, 2012

(51) Int. Cl.
| | |
|---|---|
| H01L 45/00 | (2006.01) |
| B82Y 30/00 | (2011.01) |
| B82Y 40/00 | (2011.01) |
| H01B 1/24 | (2006.01) |
| H01L 29/78 | (2006.01) |
| H01L 51/00 | (2006.01) |
| H01L 51/44 | (2006.01) |

(52) U.S. Cl.
CPC .............. *H01L 45/149* (2013.01); *B82Y 30/00* (2013.01); *B82Y 40/00* (2013.01); *H01B 1/24* (2013.01); *H01L 29/78* (2013.01); *H01L 51/0015* (2013.01); *H01L 51/444* (2013.01); *H01L 51/0048* (2013.01); *Y02E 10/549* (2013.01)
USPC .............. 257/24; 257/E45.002; 257/E21.159; 257/E21.041; 257/E23.09; 438/600; 438/3; 438/514

(58) Field of Classification Search
USPC ............... 257/9, E45.002, E21.159, E21.041, 257/E23.09, E29.054, 24; 438/600, 3, 514
See application file for complete search history.

(56) References Cited

U.S. PATENT DOCUMENTS

| | | | |
|---|---|---|---|
| 6,057,637 | A | 5/2000 | Zettl et al. |
| 6,277,318 | B1 | 8/2001 | Bower et al. |
| 6,342,276 | B1 | 1/2002 | You et al. |

(Continued)

FOREIGN PATENT DOCUMENTS

| | | |
|---|---|---|
| GB | 2 364 933 A | 2/2002 |
| JP | 2000/203821 | 7/2000 |

(Continued)

OTHER PUBLICATIONS

Ago et al., "Workfunction of Purified and Oxidised Carbon Nanotubes," Synthetic Metals, vol. 103, pp. 2494-2495, 1999.

(Continued)

*Primary Examiner* — Stephen W Smoot
*Assistant Examiner* — Edward Chin
(74) *Attorney, Agent, or Firm* — Nantero Inc.

(57) ABSTRACT

Methods for adjusting and/or limiting the conductivity range of a nanotube fabric layer are disclosed. In some aspects, the conductivity of a nanotube fabric layer is adjusted by functionalizing the nanotube elements within the fabric layer via wet chemistry techniques. In some aspects, the conductivity of a nanotube fabric layer is adjusted by functionalizing the nanotube elements within the fabric layer via plasma treatment. In some aspects, the conductivity of a nanotube fabric layer is adjusted by functionalizing the nanotube elements within the fabric layer via CVD treatment. In some aspects, the conductivity of a nanotube fabric layer is adjusted by functionalizing the nanotube elements within the fabric layer via an inert ion gas implant.

54 Claims, 26 Drawing Sheets

(56) References Cited

U.S. PATENT DOCUMENTS

| | | |
|---|---|---|
| 6,409,567 B1 | 6/2002 | Amey, Jr. et al. |
| 6,423,583 B1 | 7/2002 | Avouris et al. |
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,630,772 B1 | 10/2003 | Bower et al. |
| 6,645,628 B2 | 11/2003 | Shiffler, Jr. et al. |
| 6,706,402 B2 | 3/2004 | Rueckes et al. |
| 6,707,098 B2 | 3/2004 | Hofmann et al. |
| 6,808,746 B1 | 10/2004 | Dai et al. |
| 6,833,558 B2 | 12/2004 | Lee et al. |
| 6,835,591 B2 | 12/2004 | Rueckes et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,899,945 B2 | 5/2005 | Smalley et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 7,057,402 B2 | 6/2006 | Cole et al. |
| 7,164,209 B1* | 1/2007 | Duan et al. ............ 257/784 |
| 7,169,329 B2* | 1/2007 | Wong et al. ............ 252/502 |
| 7,335,395 B2 | 2/2008 | Ward et al. |
| 7,375,369 B2 | 5/2008 | Sen et al. |
| 7,566,478 B2 | 7/2009 | Ward et al. |
| 7,632,425 B1* | 12/2009 | Simone et al. .......... 252/182.3 |
| 7,745,810 B2 | 6/2010 | Rueckes et al. |
| 7,808,169 B2* | 10/2010 | Hirose et al. ............ 313/309 |
| 8,354,479 B2* | 1/2013 | Satoh et al. ............ 525/450 |
| 2001/0004979 A1 | 6/2001 | Han et al. |
| 2002/0160111 A1 | 10/2002 | Sun et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0095938 A1 | 5/2005 | Rosenberger et al. |
| 2005/0212014 A1 | 9/2005 | Horibe et al. |
| 2006/0115640 A1* | 6/2006 | Yodh et al. ............ 428/221 |
| 2006/0237537 A1 | 10/2006 | Empedocles et al. |
| 2006/0276056 A1 | 12/2006 | Ward et al. |
| 2007/0004191 A1 | 1/2007 | Gu et al. |
| 2007/0153353 A1* | 7/2007 | Gruner ............ 359/245 |
| 2007/0207186 A1* | 9/2007 | Scanlon et al. ............ 424/424 |
| 2008/0002755 A1* | 1/2008 | Raravikar et al. ............ 374/100 |
| 2008/0299374 A1* | 12/2008 | Choi et al. ............ 428/220 |
| 2009/0256131 A1* | 10/2009 | Schricker ............ 257/4 |
| 2010/0044671 A1* | 2/2010 | Schricker ............ 257/4 |
| 2010/0069559 A1* | 3/2010 | Koning et al. ............ 524/496 |
| 2010/0078723 A1* | 4/2010 | Bertin et al. ............ 257/350 |
| 2010/0247381 A1* | 9/2010 | Yodh et al. ............ 422/68.1 |
| 2011/0121273 A1* | 5/2011 | Jo et al. ............ 257/40 |
| 2011/0183489 A1* | 7/2011 | Ghenciu et al. ............ 438/382 |
| 2011/0220574 A1* | 9/2011 | Bakajin et al. ............ 210/650 |
| 2011/0262729 A1* | 10/2011 | Chen et al. ............ 428/221 |
| 2011/0297892 A1* | 12/2011 | Shah et al. ............ 252/511 |
| 2012/0176831 A1* | 7/2012 | Xiao et al. ............ 365/148 |
| 2012/0181621 A1* | 7/2012 | Bertin et al. ............ 257/379 |
| 2012/0282540 A1* | 11/2012 | Niu et al. ............ 429/483 |
| 2012/0299175 A1* | 11/2012 | Tran ............ 257/712 |
| 2013/0224934 A1* | 8/2013 | Roberts et al. ............ 438/478 |

FOREIGN PATENT DOCUMENTS

| | | |
|---|---|---|
| JP | 2001/035362 | 2/2001 |
| JP | 2004/090208 | 3/2004 |
| WO | WO-98/39250 | 9/1998 |
| WO | WO-98/39250 A1 | 9/1998 |
| WO | WO-99/65821 | 12/1999 |
| WO | WO-99/65821 A1 | 12/1999 |
| WO | WO-01/03208 | 1/2001 |
| WO | WO-01/03208 A1 | 1/2001 |
| WO | WO-02/45113 | 6/2002 |
| WO | WO-02/45113 A2 | 6/2002 |
| WO | WO-02/48701 | 6/2002 |
| WO | WO-02/48701 A2 | 6/2002 |
| WO | WO-03/016901 A1 | 2/2003 |
| WO | WO-03/034142 A1 | 4/2003 |

OTHER PUBLICATIONS

Ajayan, P. M. et al., "Applications of Carbon Nanotubes", Carbon Nanotubes, vol. 80, pp. 391-425, 2001.

Banerjee et al., "Functionalization of Carbon Nanotubes with a Metal-Containing Molecular Complex," Nano Letters, vol. 2, No. 1, pp. 49-53, 2002.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 1157-1161, 2001.

Dai, H. et al., "Controlled Chemical Routes to Nanotube Artchitectures, Physics, and Devices", J. Phys. Chem. B, vol. 103, pp. 11246-11255, 1999.

Delzeit et al., "Multilayered metal catalysts for controlling the density of single-walled carbon nanotube growth," Chemical Physics letters, vol. 348, pp. 368-374, Nov. 16, 2001.

Desai et al., "Freestanding Carbon Nanotube Specific Fabrication", Proc. of 2005, 5th IEEE Conf., Nanotech, Nagoya, Japan, pp. 1-4, Jul. 2005.

Franklin, N. R. et al., "An Enhanced CVD Approach to Extensive Nanotube Networks with Directionality", Advanced Materials, 5 pages, 2000.

Haddon et al.,"Purification and Separation of Carbon Nanotubes," MRS Bulletin, , pp. 252-259, Apr. 2004.

Hafner, J. H. et al., "Catalytic growth of single-wall carbon nanotubes from metal particles", Chemical Physics Letters, vol. 296, pp. 195-202, Oct. 30, 1998.

CQ Homma, Y. et al., "Single Walled Carbon Nanotube Growth on Silicon Substrates Using Catalysts", Jpn. J. Appl. Phys., Vol,. 41, Pt. 2, No. 1A/B, pp. L89-L91, 2002.

International Search Authority, International Search Report for PCT/US2005/045316 mailed Sep. 6, 2006, 2 pages.

International Search Report and Written Opinion for International Patent Application PCT/US05/18467, mailed Oct. 1, 2007, 5 pages.

(56) References Cited

OTHER PUBLICATIONS

International Search Report, International Searching Authority, for International Application PCT/US05/18539, mailed Sep. 18, 2006, 4 pages.

Jeong et al., "A new purification method of single-wall carbon nanotubes using H2S and O2 mixture gas," Chemical Physics Letters, vol. 344, pp. 18-22, Aug. 17, 2001.

Joselevich, E., "Vectorial Growth of Metallic and Semiconducting Single-Wall Carbon Nanotubes", Nano Letters, vol. 0, No. 0, pp. A-E, 2002.

Khan et al, "Solubilization of Oxidized Single-Walled Carbon Nanotubes in Organic and aqueous Solvents through Organic Derivatization," Nano Letters, vol. 2, No. 11, pp. 1215-1218, 2002.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13. pp. 1008-1014, 2001.

Nerushev, O. A., et al., "Carbon nanotube films obtained by thermal chemical vapour deposition", J. Mater. Chem., vol. 11, pp. 1122-1132, 2001.

Niu, Chunming et al., "High Power Electrochemical Capacitors Based on Carbon Nanotube Electrodes," Appl. Phys. Lett. 70(11), Mar. 17, 1997, pp. 1480-1482.

Onoa et al., "Bulk Production of singly dispersed carbon nanotubes with prescriped lengths", *Nanotechnology*, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalized Carbon Nanotube Sensors for Highly Sensitive and Selective Molecular Detection," *Nano Lett.* 2003, vol. 3(3), pp. 347-351.

Shelimov et al., "Purification of single-wall carbon nanotubes by ultrasonically assisted filtration," Chemical Physics Letters, vol. 282, pp. 429-434, Jan. 23, 1998.

Sotiropoulou, S. et al., "Carbon nanotube array-based biosensor", Anal. Bioanal. Chem, vol. 375, pp. 103-105, 2003.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Zhang et al., "Formation of metal nanowires on suspened single-walled carbon nanotubes", *Appl. Phys. Lett.*, vol. 77, p. 3015-3017, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

Awano, Y., "Graphene for VLSI: FET and Interconnect Applications," IEDM 2009 Technical Digest, pp. 10.1.1-10.1.4.

Brown, K. M. "System in package "The Rebirth of SIP"," 2004 IEEE Custom Integrated Circuits, May 2004, 6 pages.

Crowley, et al., "512 Mb PROM with 8 layers of antifuse/Diode cells," IEEE International Solid-State Circuits Conference, vol. XLVI, Feb. 2003, pp. 284-285.

Cui, et al., "Carbon Nanotube Memory Devices of High Charge," Applied Phys. Ltrs., vol. 81, No. 17, Oct. 2002, pp. 3260-3262.

Fuhrer, et al., "High-Mobility Nanotube Transistor Memory," Nano Letters, vol. 2, No. 7, 2002, pp. 755-759.

Huai, Y., "Spin-Transfet Torque MRAM (STT-MTAM): Challenges and Prospects," AAPS Bulletin, vol. 18, No. 6, Dec. 2008, pp. 33-40.

Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.

Kianian, et al., "A 3D Stackable Carbon Nanotube-based Nonvolatile Memory (NRAM)," ESSDERC, Nantero, Inc., Jun. 14, 2010, 4 pages.

Naseh, et al., "Functionalization of Carbon Nanotubes Using Nitric Acid Oxidation and DMD Plasma," World Academy of Science, Engineering and Technology, vol. 49, 2009, pp. 177-179.

Novak, et al., "Nerve Agent Using Networks of Single-Walled Carbon Nanotubes," Appl. Phys. Ltr., vol. 83, No. 19, Nov. 2003, pp. 4026-4028.

Servalli, G., "A 45nm Generation Phase Change Memory Technology," IEDM 2009 Technical Digest, pp. 5.7.1-5.7.4.

Snow, et al., "Random Networks of Carbon Nanotubes as an Electronic Material," App. Phys. Ltrs., vol. 82, No. 13, Mar. 2003, pp. 2145-2147.

Star, et al., "Nanoelectronic Carbon Dioxide sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Utegulov, et al., "Functionalization of single-walled carbon nanotubes using isotropic plasma treatment: Resonant Raman spectroscopy study," Jnrl. App. Phys. vol. 97, 2005, pp. 104324-1-104324-4.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

|  | RESET (Zero-State) of Nominal Nanoscopic Element Stack | SET (One-State) of Nominal Nanoscopic Element Stack |
| --- | --- | --- |
| Pulse Voltage | ~ 4.5 V | ~ 4.5 V |
| Rise/Fall Duration of Pulses | ~ 1.8 ns | ~ 1 µs |
| Pulse Width | ~ 50 ns | ~ 50 µs |
| Current After Function | Current after RESET is less than ~ 100 nA | Current after SET is more than ~ 1 µA |

FIG. 4

METHODS FOR ADJUSTING THE CONDUCTIVITY RANGE OF A NANOTUBE FABRIC LAYER

TECHNICAL FIELD

The present disclosure relates to nanotube fabric layers, and more particularly to methods of adjusting the conductivity range of such nanotube fabric layers.

CROSS-REFERENCE TO RELATED APPLICATIONS

This application is related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Spin-Coatable Liquid for Formation of High Purity Nanotube Films (U.S. Pat. No. 7,375,369), filed Jun. 3, 2004.

This application is related to the following U.S. patent applications, which are assigned to the assignee of the present application, and are hereby incorporated by reference in their entirety:

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Two terminal Nanotube Devices and Systems and Methods of Making Same (U.S. patent application Ser. No. 11/280,786), filed Nov. 15, 2005;

Nanotube Articles with Adjustable Electrical Conductivity and Methods of Making the Same (U.S. patent application Ser. No. 11/398,126), filed Apr. 5, 2006;

Nonvolatile Nanotube Diodes and Nonvolatile Nanotube Blocks and Systems Using Same and Methods of Making Same (U.S. patent application Ser. No. 11/835,651), filed Aug. 8, 2007;

Nonvolatile Resistive Memories Having Scalable Two terminal Nanotube Switches (U.S. patent application Ser. No. 11/835,612), filed Aug. 8, 2007;

Nonvolatile Nanotube Diodes and Nonvolatile Nanotube Blocks and Systems Using Same and Methods of Making Same (U.S. patent application Ser. No. 11/835,856), filed Aug. 8, 2008;

Memory Elements and Cross Point Switches and Arrays of Same Using Nonvolatile Nanotube Blocks (U.S. patent application Ser. No. 12/511,779), filed Jul. 29, 2009;

Nonvolatile Nanotube Diodes and Nonvolatile Nanotube Blocks and Systems Using Same and Methods of Making Same (U.S. patent application Ser. No. 12/273,807), filed Nov. 19, 2008;

Improved Switching Materials Comprising Mixed Nanoscopic Particles and Carbon Nanotubes and Methods of Making and Using Same (U.S. patent application Ser. No. 12/274,033), filed Nov. 19, 2008.

BACKGROUND

The ever increasing demand for memory storage capacity has pushed the capacity of memory devices significantly beyond 1 Gbit. Accordingly, memory elements of a memory device are required to either store and retain a minimal number of charges (e.g., fewer than 100 electrons per memory element), or sense a small change in a structural property of the memory element, such as resistivity, all with very low power consumption. In addition, memory elements must also be scalable to very high densities with a low fabrication cost. Further, in the near future, a memory element must also allow multilevel (stacking or multiple sensing levels) processing of memory cells. One of the memory elements that can meet these requirements is a recently developed nonvolatile nanotube (NVNT) switch, which is a type of resistivity memory.

One technology well suiting to meet these ever increasing demands is resistive change memory, often referred to as resistance RAMs by those skilled in the art. Such devices and arrays include, but are not limited to, phase change memory, solid electrolyte memory, metal oxide resistance memory, and carbon nanotube memory such as NRAM™.

Resistive change memory devices and arrays store information by adjusting a resistive change memory element, typically including some material that can be adjusted between a number of non-volatile resistive states in response to some applied stimuli, within each individual memory cell between two or more resistive states. For example, each resistive state within a resistive change memory cell can correspond to a data value which can be programmed and read back by supporting circuitry within the device or array.

For example, a resistive memory change element might be arranged to switch between two resistive states: a high resistive state (which might correspond to a logic "0") and a low resistive state (which might correspond to a logic "1"). In this way, a resistive change memory element can be used to store one binary digit (bit) of data. In another example, a resistive change memory element might be arranged to switch between four non-volatile resistive states, allowing a single cell to store two bits of information.

U.S. patent application Ser. No. 11/280,786 to Bertin et al., incorporated herein by reference, teaches the fabrication of such a resistive change memory element. As taught by Bertin, a two terminal nanotube switching device may be employed as a resistive change memory element. Such a nanotube switching device includes a first and second conductive terminals and a nanotube article. The nanotube article overlaps a portion of each of the first and second conductive terminals. In at least some embodiments taught by Bertin, the nanotube article is a nanotube fabric layer disposed over the first conductive terminal. In such embodiments the second conductive terminal is disposed over the nanotube fabric layer, forming a three layer device with the nanotube fabric layer substantially between the first and second conductive elements.

Bertin further teaches methods for adjusting the resistivity of the nanotube fabric layer between a plurality of nonvolatile resistive states. In at least one embodiment, electrical stimuli is applied to at least one of the first and second conductive elements so as to pass an electric current through said nanotube fabric layer. By carefully controlling these electrical stimuli within a certain set of predetermined parameters (as described by Bertin in Ser. No. 11/280,786) the resistivity of the nanotube fabric layer can be repeatedly switched between a relatively high resistive state and relatively low resistive state. In certain embodiments, these high and low resistive states can be used to store a digital bit of data (that is, a logic "1" or a logic "0").

Nanotube articles (such as those referenced by Bertin) may be realized through the formation and patterning of nanotube fabric layers and films. For example, U.S. Pat. No. 7,334,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. patent application Ser. No. 11/304,315 to Ghenciu et al., incorporated herein by reference in its entirety, teach nanotube solutions well suited for forming a nanotube fabric layer over a substrate element via a spin coating process.

SUMMARY OF THE DISCLOSURE

The current disclosure relates to methods for adjusting the conductivity range, i.e., the upper and lower limits of the conductivity of a nanotube fabric layer.

In particular, the present disclosure provides a method for adjusting the conductivity range of a nanotube fabric layer. This method comprises forming a nanotube fabric layer on a substrate. This nanotube fabric layer includes a plurality of nanotube elements and is adjustable within a conductivity range responsive to an applied stimulus. This conductivity range includes a lower limit and an upper limit. The method further comprises functionalizing at least a portion of the plurality of nanotube elements within the nanotube fabric layer to adjust at least one of the lower limit and the upper limit of the conductivity range.

The present disclosure also provides a method for forming a nanotube fabric layer. This method comprises functionalizing a plurality of nanotube elements. This method further comprises disposing the functionalized plurality of nanotube elements on a substrate to form a nanotube fabric layer. This nanotube fabric layer is adjustable within a conductivity range responsive to an applied stimulus, this conductivity range including a lower limit and an upper limit. The step of functionalizing limits at least one of the lower limit and the upper limit of the conductivity range.

The present disclosure also provides a two-terminal nanotube switching device. This devices comprises a first electrode element, a second electrode element, and a functionalized nanotube fabric layer. The functionalized nanotube fabric layer is comprised of a network of nanotube elements and includes a first side in electrical communication with the first electrode element and a second side in electrical communication with the second electrode element. The functionalized nanotube fabric layer is adjustable within a conductivity range responsive to an applied stimulus, this conductivity range including a lower limit and an upper limit. And at least one of the lower limit and the upper limit has been limited to a preselected value.

According to one aspect of the present disclosure, a nanotube fabric layer is functionalized in order to decrease the upper limit of its conductivity range.

Under another aspect of the present disclosure, a nanotube fabric layer is functionalized in order to increase the lower limit of its conductivity range.

Under another aspect of the present disclosure, a nanotube fabric layer is functionalized in order to increase the upper limit of said conductivity range.

Under another aspect of the present disclosure, a nanotube fabric layer is functionalized in order to decrease the upper limit of said conductivity range.

Under another aspect of the present disclosure, a nanotube fabric layer is functionalized in order to increase the uniformity of its conductivity range.

Under another aspect of the present disclosure, a nanotube fabric layer is functionalized in order to introduce at least one irreversible defect within the nanotube fabric layer.

Under another aspect of the present disclosure, a nanotube fabric layer is functionalized in order to introduce at least one switching site within the nanotube fabric layer.

Under another aspect of the present disclosure, a nanotube fabric layer is functionalized in order to eliminate at least one switching site within the nanotube fabric layer.

Under another aspect of the present disclosure, a nanotube fabric layer is functionalized by dispersing a gas over the nanotube fabric layer, so as to adjust the conductivity of the nanotube fabric layer.

Under another aspect of the present disclosure, a nanotube fabric layer is functionalized by dispersing a filler material, e.g., ions of an inert gas or a chemically active substance, over the nanotube fabric layer, such that the filler material penetrates through a portion of the nanotube fabric layer or through the entire nanotube fabric layer. The filler material may be dispersed using a chemical vapor deposition process.

Under another aspect of the present disclosure, a functionalized nanotube fabric layer may be realized by combining a plurality of nanoscopic particles with the nanotube elements to form an application solution and depositing the application solution over a substrate.

Under another aspect of the present disclosure, nanoscopic particles intermixed with the nanotube elements within a nanotube fabric layer may increase the conductivity of fabric layer.

Under another aspect of the present disclosure, nanoscopic particles intermixed with the nanotube elements within a nanotube fabric layer may decrease the conductivity of fabric layer.

Under another aspect of the present disclosure, a nanotube fabric layer may be functionalized by implanting ions of an inert gas or a chemically active substance to introduce defects into the fabric layer.

Under another aspect of the present disclosure, a masking layer is used to allow functionalization to occur within certain preselected regions of a nanotube fabric layer.

Accordingly, the semiconductor device consistent with the present disclosure may include a functionalized fabric layer to limit or cap its minimum resistivity. The resistivity or conductivity of the semiconductor device consistent with the present disclosure may thus be centered in an operating window of the two-terminal nanotube switching device drive circuitry. Further, the conductivity and switching properties of the semiconductor device consistent with the present disclosure can be adjusted, so as to enhance the ability to scale the two-terminal nanotube switching device.

BRIEF DESCRIPTION OF THE DRAWINGS

FIG. 4 illustrates a table of typical switching characteristics for a semiconductor device in accordance with one embodiment consistent with the present disclosure.

DETAILED DESCRIPTION

Figure 1:
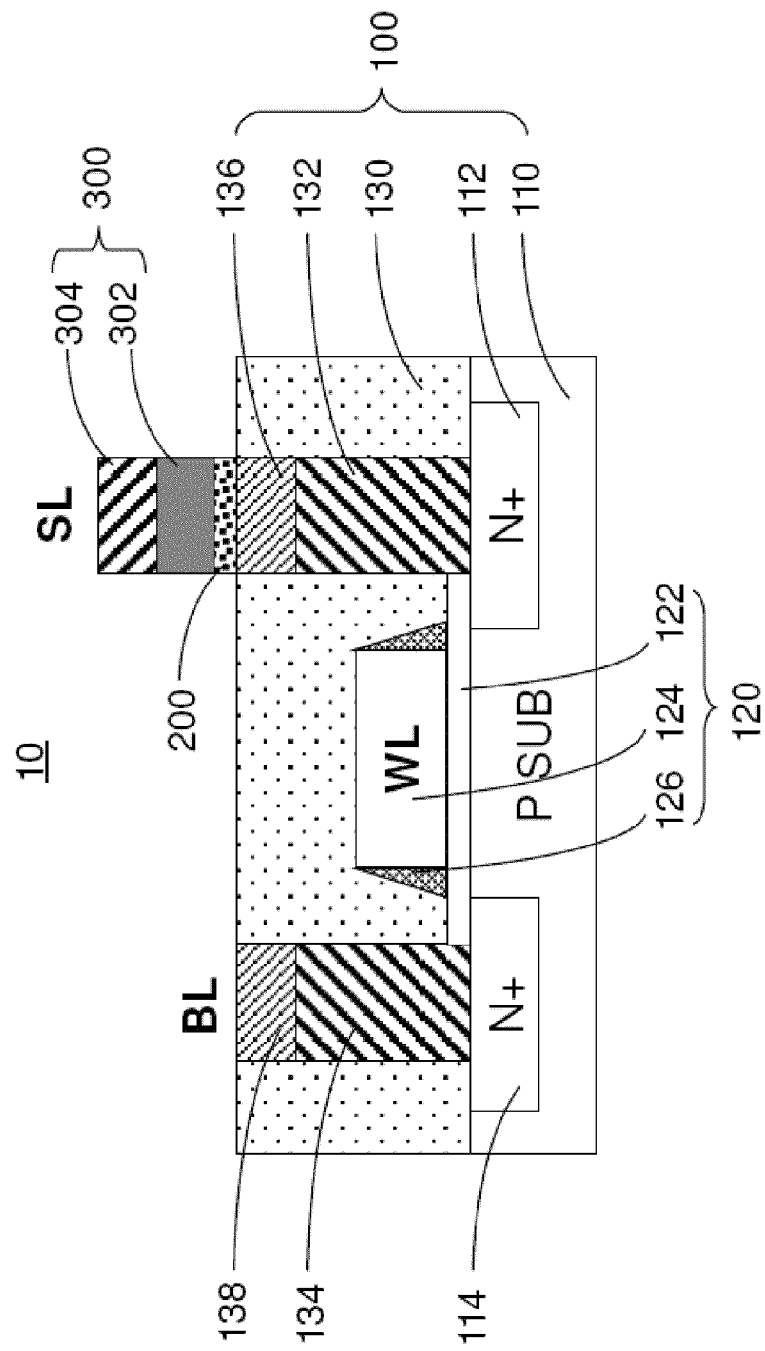
FIG. 1 illustrates a semiconductor device including a transistor, in accordance with one embodiment consistent with the present disclosure.

The present disclosure teaches methods to adjust and/or limit the conductivity range of a nanotube fabric layer. In some aspects of the present disclosure this conductivity range is adjusted and/or limited by functionalizing—that is, chemically modifying—the nanotube elements in the nanotube fabric layer via wet chemistry techniques (e.g., by incorporating dielectric materials onto the surface of the nanotube elements). In other aspects of the present disclosure this conductivity range is adjusted and/or limited by functionalizing the nanotube elements in the nanotube fabric layer via plasma treatment (e.g., exposing a nanotube fabric layer to an ionized plasma gas). In other aspects of the present disclosure this conductivity range is adjusted and/or limited by functionalizing the nanotube elements in the nanotube fabric layer via CVD treatment (e.g., using a CVD process to coat the nanotube elements with dielectric material). In other aspects of the present disclosure this conductivity range is adjusted and/or limited by functionalizing the nanotube elements in the nanotube fabric layer via an ion implant (e.g., implanting ions into the nanotube elements so as to introduce defects). While the present disclosure references the above methods of functionalizing nanotubes, other techniques, which are well known to those skilled in the art, may be used to functionalize the nanotubes and thereby adjust the conductivity range of the fabric.

Within some aspects of the present disclosure a nanotube layer may be functionalized (via one or more of a plurality of the methods discussed) in situ. That is, a plurality of nanotube elements are deposited onto a substrate layer to form a nanotube fabric layer which is then subjected to functionalization (via, for example, an ion implant process as described by the present disclosure). Within such aspects no chemical modification of the nanotube elements is required prior to the formation of the nanotube fabric layer, which may be convenient within certain applications wherein modification and/or treatment of a nanotube application is undesirable.

Within other aspects of the present disclosure a nanotube fabric layer may be functionalized by chemically modifying nanotube elements in solution. That is, a nanotube application solution (comprising a plurality of nanotube elements suspended in a liquid medium) may be subjected to functionalization (via, for example, the introduction of dielectric filler material into the solution to coat surface of the nanotubes) prior to its deposition over a substrate. In this way, the formed nanotube fabric layer will be functionalized according to the methods of the present disclosure as it is formed, and require no additional chemical modification to realize a desired conductivity range. Such aspects of the present disclosure may be convenient within certain applications wherein modification and/or treatment of a formed nanotube fabric layer is undesirable.

Further, the methods of present disclosure provide techniques for controlling the density of the uniformity of switching sites (areas within the nanotube fabric layer where conductive paths through the nanotube fabric layer may be made or broken) within a nanotube fabric layer. As will be discussed further below, the density and uniformity of switching sites can become key parameters in a nanotube fabric layer for certain applications. For example, as the geometry of devices employing nanotube fabric layers is reduced, the need to reliably predict how many switching sites present in a certain cross-sectional area of fabric may be critical to the design of such devices. The methods of the present disclosure also provide techniques for introducing irreversible defects within a nanotube fabric layer. Such defects might be thought of—in certain applications—as switching sites that are substantially permanently open. That is, these irreversible defect sites permanently interrupt otherwise conductive paths through the nanotube fabric layer. As will be discussed further below, such irreversible defects may be introduced into a nanotube fabric layer (or a certain portion of a nanotube fabric layer) in order to limit the lower end of the conductivity range of a nanotube fabric layer.

Nanofabrics

A fabric of nanotubes as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Descriptions of nanotube fabrics may be found in, for example, U.S. Pat. No. 7,745,810, entitled "Nanotube Films and Articles," and U.S. application Ser. No. 12/512, 428, entitled "Non-Volatile Electromechanical Field Effect Devices and Circuits Using Same and Methods of Forming Same," the entire contents of which are incorporated herein by reference in their entirety.

Alternatively, or in addition, for example, the fabric of nanotubes for the present disclosure may possess some degree of positional regularity of the nanotubes, e.g., some degree of parallelism along their long axes. In some examples, such positional regularity may be found on a relatively small scale, wherein flat arrays of nanotubes are arranged together along their long axes in rafts on the order of one nanotube long and ten to twenty nanotubes wide. In other examples, such positional regularity may be found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications, the fabric preferably has a sufficient amount of nanotubes in contact so that at least one electrically conductive or semi-conductive pathway exists from a given point within the fabric to another point within the fabric. Nanotubes typically may have a diameter of about 1-2 nm and may have lengths ranging from about half a micron to about 200 microns, for example. The nanotubes may curve and occasionally cross one another. Gaps in the fabric, i.e., between nanotubes either laterally or vertically, may exist. Such fabrics may comprise single-walled nanotubes, multi-walled nanotubes, or both. The fabric may have small areas of discontinuity with no tubes present. The fabric may be prepared as a layer or as multiple fabric layers, one formed upon another. The thickness of the fabric can be chosen as thin as substantially a monolayer of nanotubes or can be chosen much thicker, e.g., tens of nanometers to hundreds of nanometers in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent, printing, and electrostatic spray coating. Nanoparticles of other materials can be mixed with suspensions of nanotubes in such solvents and deposited by spin coating and spray coating to form fabrics with nanoparticles dispersed among the nanotubes. Such exemplary methods are described in more detail in the related art cited in the Background section of this disclosure.

As described within U.S. Pat. No. 7,375,369 to Sen et al. and U.S. patent application Ser. No. 11/304,315 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer.

It should be noted that nanotube elements used and referenced within the embodiments of the present disclosure may be single walled nanotubes, multi-walled nanotubes, or mixtures thereof and may be of varying lengths. Further, the nanotubes may be conductive, semiconductive, or combinations thereof.

Within certain applications it is desirable to control the lower limit of the resistivity range of a nanotube fabric layer. For example, within a two terminal nanotube switching device such a limitation may reduce the power (current times voltage) required to switch the device from a low resistivity state to a high resistivity (or an intermediate state, if the device has been configured to employ more than two resistive states).

Further, within certain applications it may also be desirable to control the resistivity operating window (that is, the range between the highest and lowest resistivity states) of a nanotube fabric layer by centering this operating window such that the fabric layer tends to remain in a resistance range optimized for a desired set of stimulus circuitry. This resistivity operating window can be defined as a resistivity range between the minimum resistivity and the maximum resistivity of a non-volatile nanotube (NVNT) switch—such as, but not limited to, the two terminal nanotube switching device taught by Bertin in U.S. patent application Ser. No. 11/280, 786, the entire contents of which are incorporated by reference. The desired operating range is primarily controlled by the minimum resistivity, because the maximum resistivity is capped or limited by an open switch. Moreover, because the intrinsic as-deposited fabric relies on random switching sites that may not align with the memory cells, there is also a need to provide the ability to adjust the conductivity and switching properties of a carbon nanotube fabric layer on a nanometer scale, so as to enhance the ability to scale the NVNT switch to nanometer dimensions. The described adjusted nanotube fabrics can be used to make semiconductor devices.

Nanofabric Devices

Figure 2:
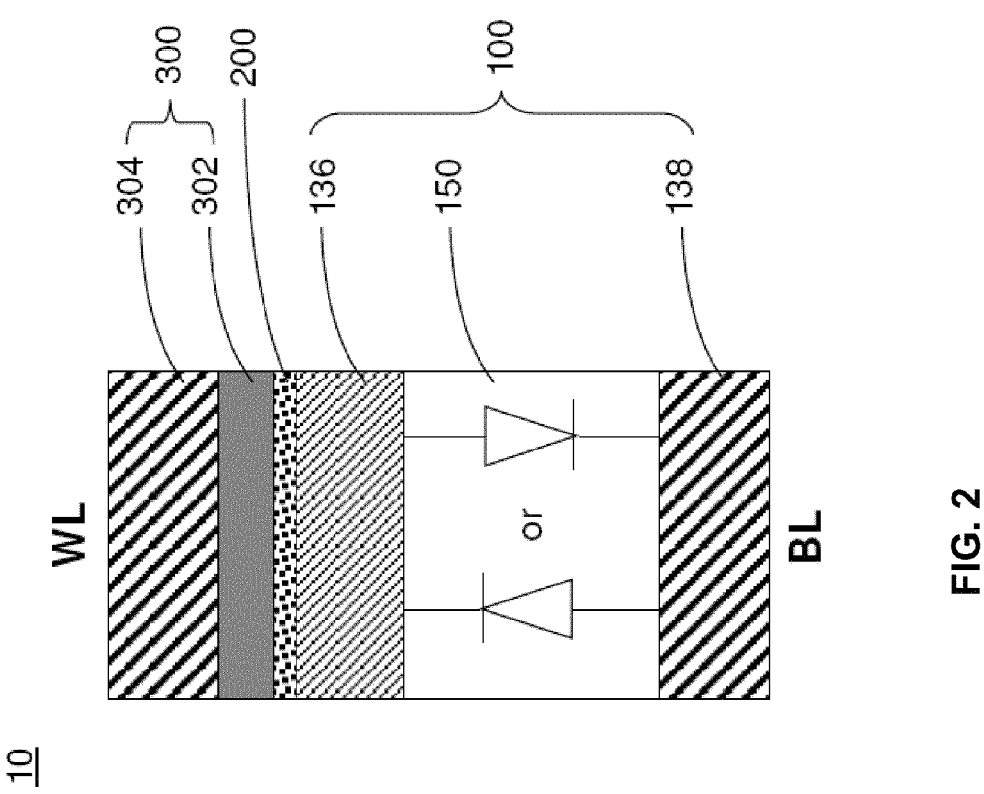
FIG. 2 illustrates a semiconductor device including a diode, in accordance with one embodiment consistent with the present disclosure.

Referring to FIGS. 1 and 2, there is illustrated a semiconductor device 10 in accordance with an embodiment of the present disclosure. Semiconductor device 10 may include a three-dimensional (3D) nanotube switch, in which logic states (i.e. "0" and "1" states) may be written or switched for multiple cycles. It is noted that semiconductor device 10 may be configured as a non-volatile memory array, such as an NAND or NOR array in Programmable Logic Array (PLA), Field Programmable Gate Array (FPGA), and Programmable Logic Device (PLD) configurations. Semiconductor device 10 may include an electronic element 100, a nanotube fabric layer 200 coupled to electronic element 100, and a terminal 300 coupled to fabric layer 200. In some embodiments, electronic element 100 may be a three terminal control element, such as a transistor 100, as illustrated in FIG. 1, or a two terminal control element, such as a diode 100, as illustrated in FIG. 2.

As shown in FIG. 1, transistor 100 includes a substrate 110 having a source region 112 and a drain region 114, and a gate structure 120 formed on substrate 110 between source region 112 and drain region 114. Transistor 100 may be a bipolar junction transistor (BJT), a field effect transistor (FET), and the like. In this particular embodiment, substrate 110 may be formed of a P-type semiconductor, and source region 112 and drain region 114 may be heavily doped with N-type dopants. Gate structure 120 includes a gate insulating layer 122 formed on an upper surface of substrate 110, a gate electrode 124 formed on gate insulating layer 122, and spacers 126 formed on side-walls of gate electrode 124. Gate electrode 124 may be coupled to a word line (WL) of a memory array circuit. An insulating layer 130 is formed on gate structure 120 and substrate 110. Insulating layer 130 includes via holes, in which a first plug 132 is formed to couple source region 112 with a bottom electrode 136, and a second plug 134 is formed to couple drain region 114 with a bit line (BL) of a memory array circuit through a transistor electrode 138.

Referring again to FIG. 1, a surface of fabric layer 200 may be coupled with transistor 100 through bottom electrode 136, while an opposite surface of fabric layer 200 may be coupled with a source line (SL) of a memory array circuit through a top electrode 302 of terminal 300. In one embodiment consistent with the present disclosure, fabric layer 200 may include a plurality of carbon nanotubes (CNT), which may be treated or functionalized to adjust the electrical conductivity and/or structural state thereof. It is to be understood that the conductivity may be adjusted temporarily or permanently.

As shown in FIG. 2, diode 100 includes a junction portion 150. A surface of junction portion 150 is coupled with a bit-line (BL) through a diode electrode 138, while an opposite surface of junction portion 150 is coupled with a bottom electrode 136. In some embodiments, junction portion 150 may be a P-N junction, a metal-to-semiconductor contact, or the like. A surface of fabric layer 200 may be coupled with diode 100 through bottom electrode 136, while an opposite surface of fabric layer 200 may be coupled to a word line (WL) of a memory array circuit through a top electrode 302 of terminal 300. In one embodiment consistent with the present disclosure, fabric layer 200 may include a plurality of carbon nanotubes (CNT), which may be treated or functionalized to adjust the electrical conductivity and/or structural state thereof.

Conductivity Adjusted Nanofabrics

The electrical properties of the fabric layer 200 will be discussed in more detail with respect to FIGS. 3-6.

Figure 3:
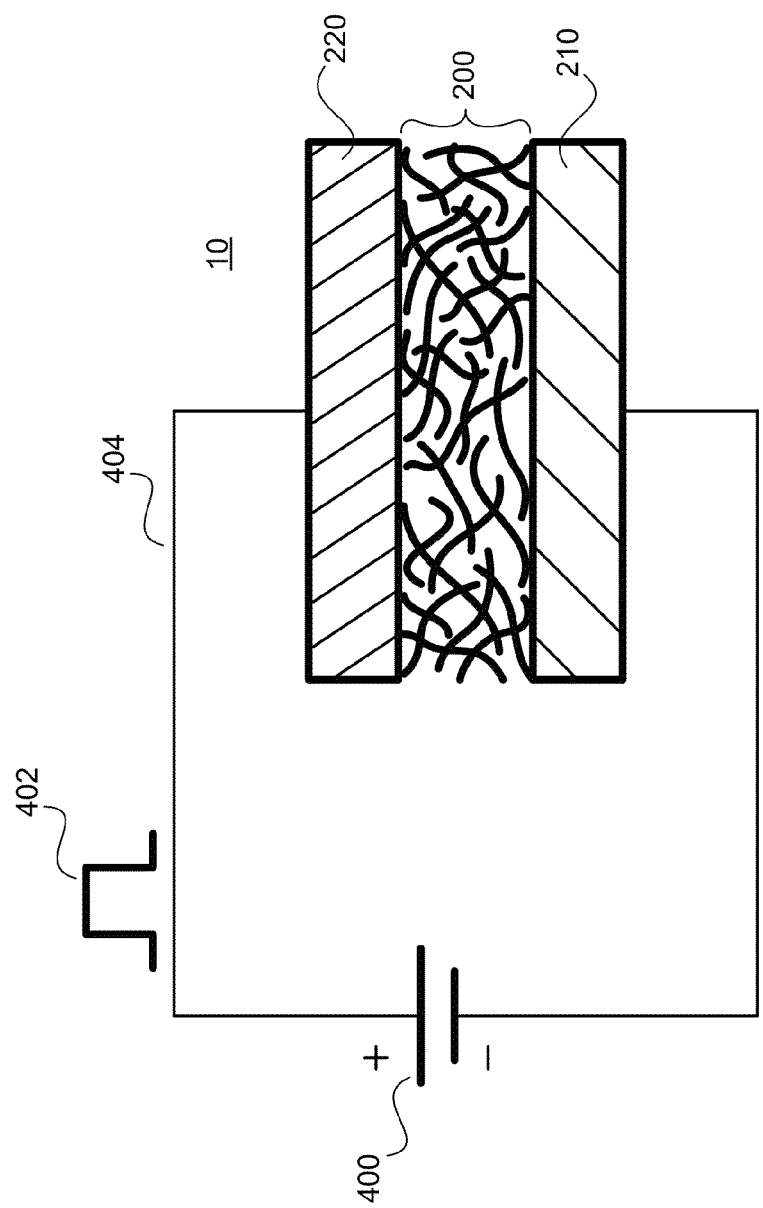
FIG. 3 illustrates a semiconductor device electrically coupled to a power source, in accordance with one embodiment consistent with the present disclosure.

FIG. 3 illustrates a two-terminal nanotube switching device which includes a nanotube fabric layer 200 positioned between a first electrode element 210 and a second electrode element 220. Responsive to as electrical stimulus 402 provided from power source 400 along wiring path 404, nanotube fabric layer 200 may be adjusted to a plurality of non-volatile resistive states. As previously discussed, two or more of these non-volatile resistive states may be used to store information (for example a relatively low resistive state might correspond to a logic "1" and a relatively high resistive state might correspond to a logic "0") allowing such a two-terminal switch device to function as a non-volatile memory cell.

For example, in certain applications to switch the resistive state of fabric layer 200 from a high conductivity state (RESET) to a low conductivity state (SET), a short current pulse of a few nanoseconds (ns) at an appropriate voltage may be used for electric pulse 402. Such an electric pulse 402 may cause carbon nanotubes of fabric layer 200 to become electrostatically attractive with, for example, neighboring nanotubes. Electric pulse 402 may also cause carbon nanotubes of fabric layer 200 to become electrostatically attractive with electrodes 210 and 220, or with defect sites of other nanotubes. After electrostatic contacts are formed, carbon nanotubes may be held together via the Van der Waals force interactions at the contacting areas. The applied voltage then returns to zero, leaving fabric layer 200 in its low conductivity state. Typical switching characteristics for the carbon nanotubes of fabric layer 200 are illustrated in FIG. 4.

For example, to switch the resistive state of fabric layer 200 from a low conductivity state (SET) to a high conductivity state (RESET) and to maintain that fabric layer 200 be a "reversible" switch, the Van der Waals force at the contacting areas must be overcome such that the resistive state of fabric layer 200 returns to a high conductivity state. This may be accomplished by applying a current pulse of a few tens of nanoseconds (ns) with an appropriate voltage. Such a current pulse may heat up the contacting areas of carbon nanotubes and introduce phonons or vibrations to the carbon nanotubes. As a result, the Van der Waals force is overcome and the fabric layer 200 returns to a high conductivity state. Typical switching characteristics for the carbon nanotubes of fabric layer 200 are illustrated in FIG. 4.

The methods of the present disclosure may be used to control or set the range of this resistivity adjustment allowing for, in certain applications, improved operation of a two-terminal switching element such as is depicted in FIG. 3.

In one embodiment, fabric layer 200 may comprise "reversible" defects that can be switched between low and high conductivity states and vice versa—that is, defects within a nanotube fabric layer which are repaired via an applied electrical stimulus during a SET operation. Fabric layer 200 may also comprise "irreversible" defects that remain in a low conductivity state after a SET operation—that is, defects which remain unresponsive to and are not repaired by an electrical stimulus provided during a SET operation. Irreversible defects may be useful for placing a cap on the minimum device resistance so that a lower voltage and/or current may be used during the SET operation by shifting or centering the ON/OFF window of semiconductor device 10 to a desired range. That is, by adjusting the conductivity range of a nanotube fabric layer 200, the upper conductivity limit can be adjusted such that the material will never exhibit a resistance value below a certain threshold. Voltage and current levels for a RESET operation—that is, an operation which renders the fabric layer 200 from a highly conductive/low resistive state to a low conductive/highly resistive state—are typically indirectly proportional to the resistance value of the material prior to the operation. That is, the lower the resistivity (or, taken another way, the higher the conductivity) a nanotube fabric layer exhibits in a SET state, the higher the voltage and current levels will be required to render the material into a RESET state. By providing a lower limit to the conductivity range of a nanotube fabric layer, the voltage and current requirements of a RESET operation can be limited.

For example, in certain applications a deposited nanotube fabric layer may be initially adjustable within a resistance range of tens of kilo-ohms (in the lower resistivity state) to hundreds of mega-ohms (in the higher resistivity state). Using the methods of the present disclosure, such a nanotube fabric layer may be functionalized and/or defects introduced with the fabric such that this resistance range is adjusted and that the lower resistivity state is on the order of hundreds of kilo-ohms, for example. In another example, such a nanotube fabric layer might be functionalized such that this resistance range is adjusted and that the higher resistivity state is on the order of tens of mega-ohms, for example.

Further, within practical two-terminal nanotube switching elements (as described within the present disclosure and the incorporated references), there can be, in certain applications, a danger of entering a deep SET condition. Such a condition is characterized by a switching element, which is driven into a resistive state so low that the available stimulus circuitry cannot provide adequate stimuli to render the nanotube fabric layer within the switching element back into a valid RESET state. In such a case, the nanotube switching element might be considered dead or stuck, and become permanently lost to an array of which it is a part. This deep SET condition can be especially problematic—within certain applications—in commercial memory arrays where onboard programming circuitry is significantly limited due to power or space restrictions. In this respect, the methods of the present disclosure are well suited to substantially eliminate the possibility of a two-terminal nanotube switching element from entering a deep SET condition. By using the methods of the present disclosure to limit the lower end of the resistive range of the nanotube fabric layer within switching element during the fabrication process, the SET state of the switching element can be relied on to never drop below a predetermined resistance threshold, thus ensuring that the provided programming circuitry will always be able to render the device back into a valid RESET state.

Figure 5:
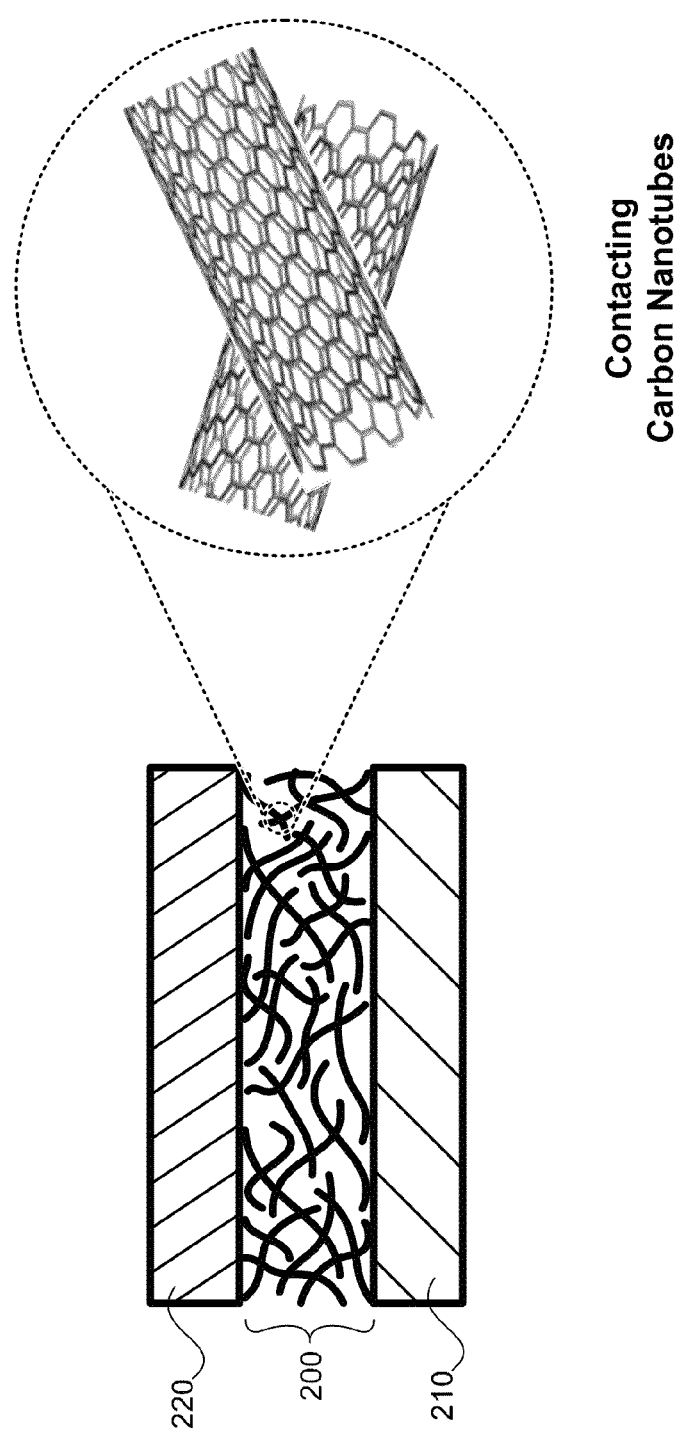
FIG. 5 illustrates naturally occurring nanotube-to-nanotube contacts of carbon nanotubes, in accordance with one embodiment consistent with the present disclosure.
Figure 6:
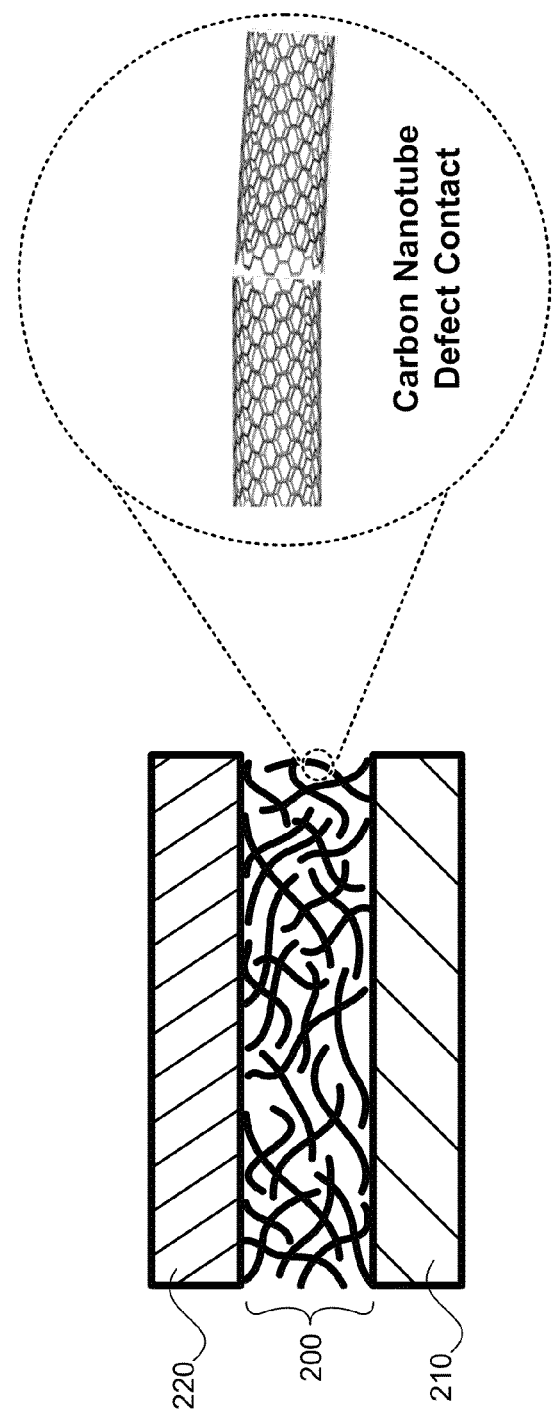
FIG. 6 illustrates defect contacts of carbon nanotubes, in accordance with one embodiment consistent with the present disclosure.

Further, in certain applications the resistivity (or, taken another way, the conductivity) of a nanotube fabric layer 200 relies on the naturally occurring nanotube-to-nanotube contacts in fabric layer 200, as illustrated in FIG. 5, and/or defects in the carbon nanotubes of fabric layer 200, as illustrated in FIG. 6. Within such applications, these nanotube-to-nanotube contacts and/or defects can be thought of as switching sites within the nanotube fabric layer 200. That is, these switching sites can be used to interrupt a conductive path from one side of the nanotube fabric layer 200 to another side. Within a nanotube fabric layer a plurality of these conductive paths may exist in parallel, providing good electrical communication through the material layer. By interrupting a certain percentage of these conductive paths (at the switching sites), the conductivity of the nanotube fabric layer 200 can be significantly reduced. By restoring these conductive paths (again, at the switching sites) the conductivity of the nanotube fabric layer 200 can be restored.

Accordingly, within such applications the switching mechanism of a nanotube fabric layer depends on the random generation of switching sites (repairable or permanent defects in individual nanotubes or the contact between two or more adjacent nanotubes) throughout the fabric layer. As the geometry of two-terminal nanotube switching devices employing such nanotube fabric layers scales to smaller and smaller dimensions (for example, on the order of tens of nanometers), statistics indicate that the level of non-functioning bits may rise depending on the density of naturally occurring contacts and/or defects. That is, at these smaller geometries, the density and uniformity of these switching sites throughout a nanotube fabric layer might be such that a certain percentage of the two-terminal nanotube switching elements within an array will not include sufficient switching sites to function.

Functionalization of Nanofabrics

Accordingly, the methods of the present disclosure may be used to increase the density and uniformity of switching sites within a nanotube fabric layer, facilitating the fabrication of two-terminal nanotube switching devices at smaller and smaller geometries. To this end, carbon nanotubes may be functionalized—that is, chemically modified—to provide switching sites by performing, for example, ion implantation and/or plasma modification. Such functionalization of carbon nanotubes may introduce contact modification between nanotubes and/or between nanotubes and contacting electrodes. The functionalization of carbon nanotubes may also introduce repairable defects in fabric layer 200, such that fabric layer 200 may become reversible (i.e., able to switch between a high resistance RESET ("0" state) condition to a low resistance SET ("1" state) condition and vice versa) or irreversible (i.e., permanently set in one state or the other).

In one embodiment, functionalization of carbon nanotubes includes the chemical modification of the carbon nanotubes which may occur either covalently or non-covalently. It is to be understood that functionalization may include other modifications of the carbon nanotubes, for example, the physical or structural modification of carbon nanotubes. One way to functionalize carbon nanotubes is to attach chemical functional groups to the carbon nanotubes. The attachment of chemical functional groups may overcome several barriers to their widespread applications, including, but not limited to, the ability to solubilize carbon nanotube bundles, improve processibility, carbon nanotube purification, sensor activation, and functionalization to facilitate chemical delivery via carbon nanotubes. Functionalization of carbon nanotubes may be characterized by various spectroscopic methods, such as, Raman Spectroscopy, X-ray Photoelectron Spectroscopy (XPS), Fourier Transform Infrared Spectroscopy (FTIR), and Energy Dispersion X-ray analysis (EDX).

In some aspects, the introduction of a defect into an individual carbon nanotube can be thought of as modifying the nanotube structure in such as a way as to inhibit the movement of free electrons over the nanotube's surface. Because carbon nanotubes are cylindrical, rolled up graphene layer or layers, the conductivity thereof can be attributed to electron delocalization within the $sp^2$ carbon layer. The non-hybridized pi ($\pi$) electrons are free to move around and are thus able to conduct electricity. Any disruption to the aromatic, conjugate systems would reduce the number of pi ($\pi$) electrons and increase the resistance of the carbon nanotubes. Functionalization to introduce such defects with a nanotube fabric layer—and thereby modify the conductivity of a nanotube fabric layer— may be accomplished by, for example, wet chemistry, plasma treatment, chemical vapor deposition (CVD), introduction of filler materials in fabric layer 200, and ion implantation.

Functionalization by Wet Chemistry

In general, there are at least two ways to functionalize a carbon nanotube fabric layer by wet chemistry: (1) diminishing the conjugate system by converting part of $sp^2$ carbon atoms to $sp^3$ carbon atoms (thereby introducing defects through the nanotube fabric layer); and (2) incorporating dielectric filler materials onto the surface of the nanotubes (thereby reducing the number of nanotube-to-nanotube contacts throughout the nanotube fabric layer). Each of these techniques can be used to limit the lower end of the conductivity range of the nanofabric.

In certain applications it may be convenient to use wet chemistry to functionalize nanotubes in solution—that is, while the nanotubes are suspended in liquid medium and prior to the formation of a nanotube fabric layer. In this way no further modifications to the fabric layer would be required after the nanotube elements were deposited.

Figure 7:
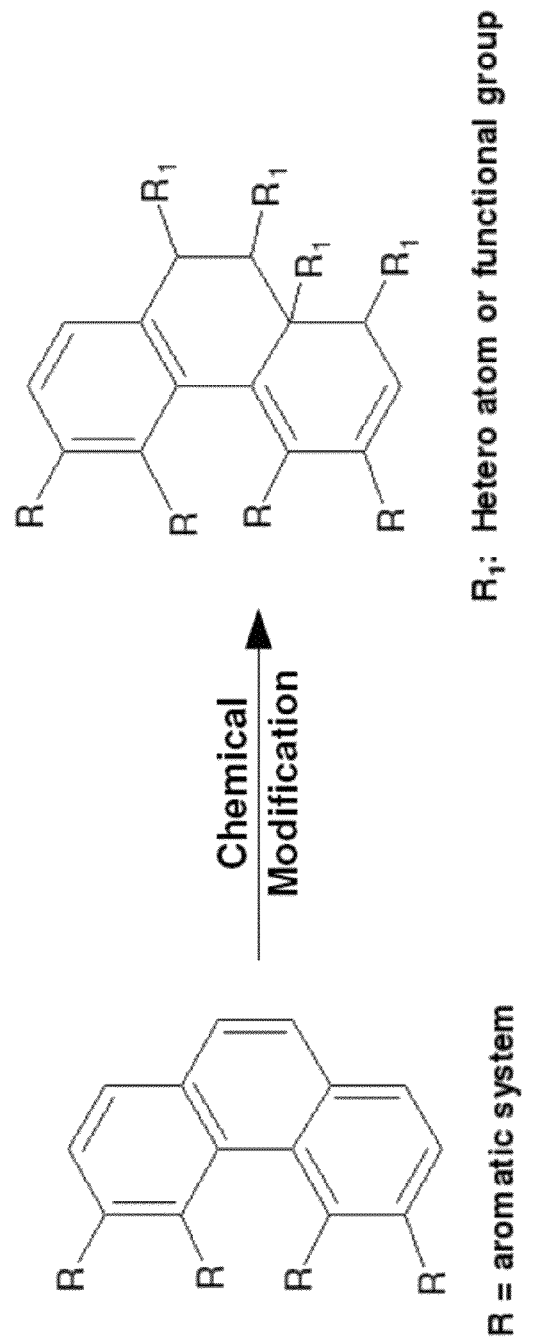
FIG. 7 illustrates a chemical modification reaction of carbon nanotubes in accordance with one embodiment consistent with the present disclosure.

Diminishing the Conjugate System:

FIG. 7 illustrates a chemical modification reaction of carbon nanotubes in accordance with one embodiment consistent with the present disclosure. Such a chemical modification may be used to introduce defects within nanotube fabric layer, reducing the conductivity of the nanotube fabric layer. As shown, a starting conjugate system may be reduced or partially destroyed by introducing hetero-atoms or functional groups R1 onto unsaturated carbons and converting part of $sp^2$ carbons into $sp^3$ carbons. For example, functional group R1 may be a hydrogen (H) atom, a halogen element (e.g., chloride (Cl) or fluorine (F)), a hydroxide (OH), an aromatic ring, or an organic group.

Hydrogenation (R1=H):

Carbon nanotubes may react with hydrogen (H) atoms to produce hydrogenated or modified carbon nanotubes. The resulting modified carbon nanotubes have been reported to be stable up to a temperature of at least 500° C.

Halogenation (R1=Cl or F):

Carbon nanotubes may also react with halogen elements. For example, carbon nanotubes can be treated with fluorine (F) gas, $XeF_2$ gas, or chlorine (Cl) gas to incorporate the halogen elements onto a carbon surface. These are essentially addition reactions for the carbon-carbon double bonds.

Hydroxidation (R1=OH, or Other Oxygen Functionalities):

Carbon-carbon double bonds may be destroyed by using transition-metal oxidants, such as $KMnO_4$, $OsO_4$, organic peroxides, such as t-butyl peroxide, and peroxy acids, such as peroxybenzoic acid, to introduce carbon-oxygen bonds.

Diazonium Reaction (R1=Aromatic Ring or Ar):

Diazonium reactions are versatile reactions, which allow the formation of covalent carbon-carbon bonds for a carbon surface. The conjugate aromatic system may be interrupted by the formation of the carbon-carbon bonds. Accordingly, the resistance of the carbon nanotubes may be increased.

Cycloadditions (R1=Organic Groups):

Carbon-carbon double bonds may undergo [2+1] reactions with very reactive carbene (or nitrene) species, such as dichlorocarbene to form three-membered rings with various functional groups. The carbon-carbon double bonds in nanotubes may undergo other types of cycloadditions to produce products corresponding to the types of cycloadditions. For example, a carbon surface may react with dienophile, such as maleic anhydride. Alternatively, a carbon surface may also undergo 1,3-dipolar cycloadditions.

Coating the Nanotube Surface with Insulating or Dielectric Filler Material:

The surface of conductive carbon nanotubes may be partially or totally coated with a layer of insulating or dielectric materials, such as silica. In this way, the nanotube-to-nanotube interconnections within a nanotube fabric layer may be significantly reduced, thereby limiting the lower conductivity limit of the nanotube fabric layer. Likewise, the coating layer on the surface of the nanotubes may cause an inductive effect, and thus may affect the conductivity of the nanotubes. The coating can be realized by forming covalent bonds to the nanotube surface, or by physically adsorbing coating materials on the nanotube surface (or by absorbing materials within the nanotube film or fabric layer).

Figure 8:
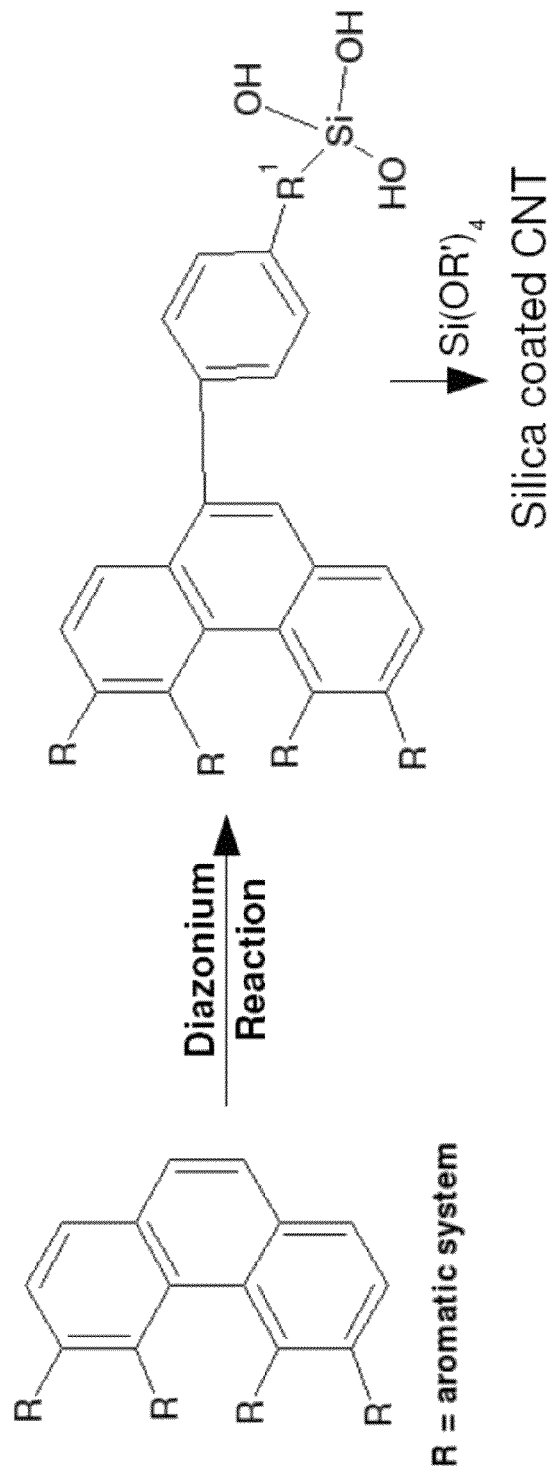
FIG. 8 illustrates a diazonium reaction of carbon nanotubes in accordance with one embodiment consistent with the present disclosure.

Covalent Bond Formation:

As illustrated in FIG. 8 (R1=linker, R'=methyl or ethyl group), diazonium reaction may be used to introduce silica material to a nanotube surface. After the diazonium reaction, further reactions with, for example, a certain amount of tetraethyloxysilane (TEOS) in aqueous medium may form a silica coating layer on the nanotube surface. Such a coating layer will provide a dielectric barrier between the nanotube and other adjacent nanotubes, reducing nanotube-to-nanotube interconnections throughout the nanotube fabric layer and thereby reducing the lower conductivity limit of nanotube fabric layer.

Figure 9:
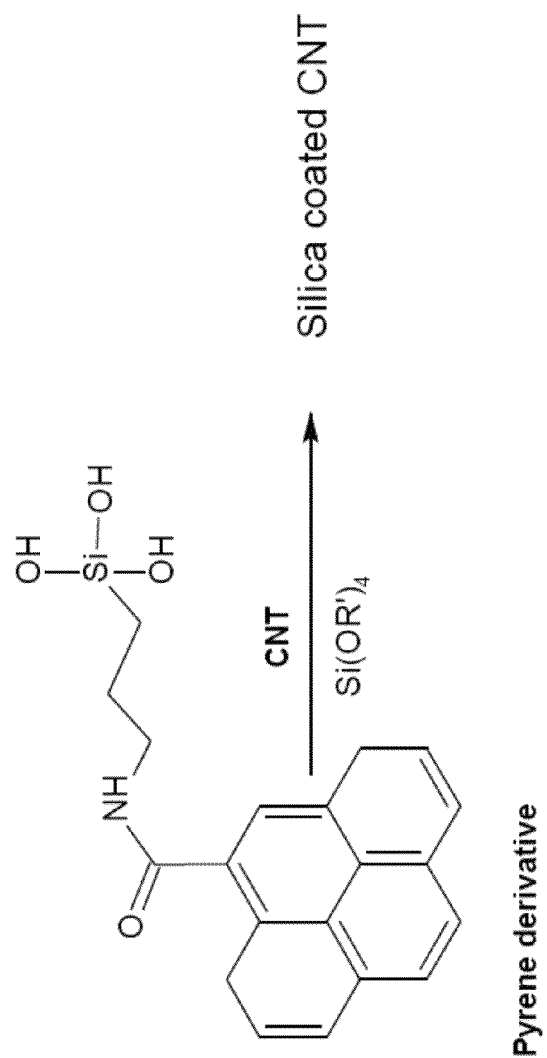
FIG. 9 illustrates the preparation of a silicon containing pyrene derivative in accordance with one embodiment consistent with the present disclosure.

Physical Adsorption:

As illustrated in FIG. 9, a silicon containing pyrene derivative can be prepared chemically. Silica coated carbon nanotubes may be formed by adsorption of this pyrene derivative onto a nanotube surface, followed by silicon-oxygen chain extension through hydrolysis of TEOS. Such a coating layer will provide a dielectric barrier between the nanotube and other adjacent nanotubes, reducing nanotube-to-nanotube interconnections throughout the nanotube fabric layer and thereby reducing the lower conductivity limit of nanotube fabric layer.

The wet chemistry functionalization embodiments described above are for illustrative and explanatory purposes only. It is not intended to be exhaustive nor to limit the scope of the present disclosure to the precise form of wet chemistry disclosed. It is to be understood that modifications and/or variations are possible in light of the above disclosures, or may be acquired from practice of the embodiments. Accordingly, it is intended that the true scope of the present disclosure be defined by the appended claims and their equivalents.

Functionalization by Plasma Treatment

Figure 10:
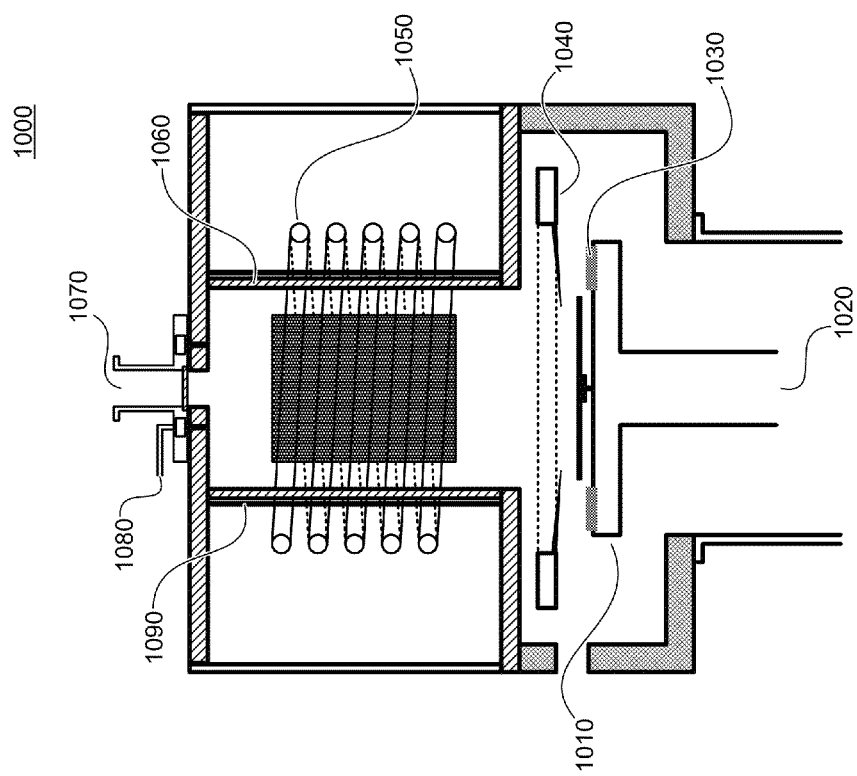
FIG. 10 illustrates an apparatus for functionalizing carbon nanotubes, in accordance with one embodiment consistent with the present disclosure.
Figure 11:
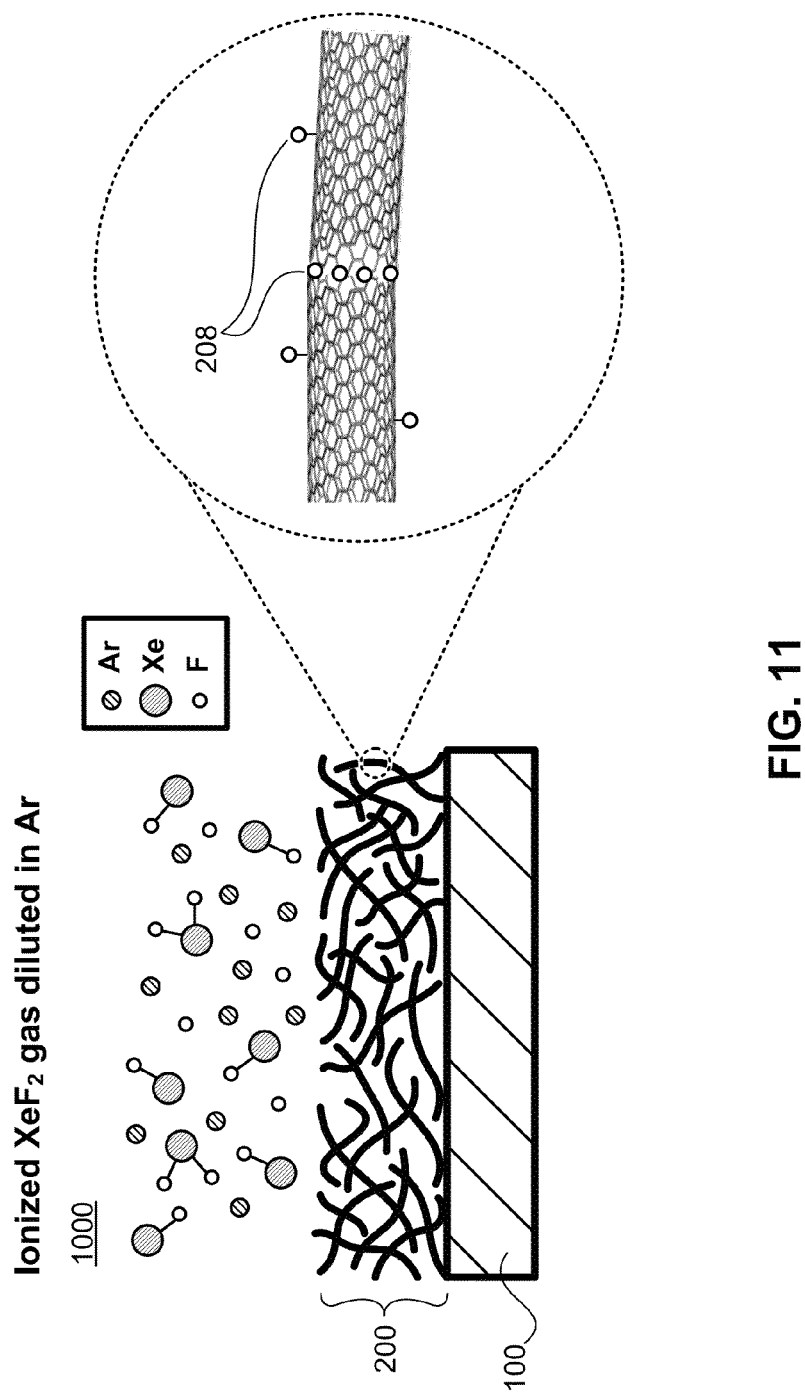
FIG. 11 illustrates an apparatus for functionalizing carbon nanotubes, in accordance with one embodiment consistent with the present disclosure.
Figure 12:
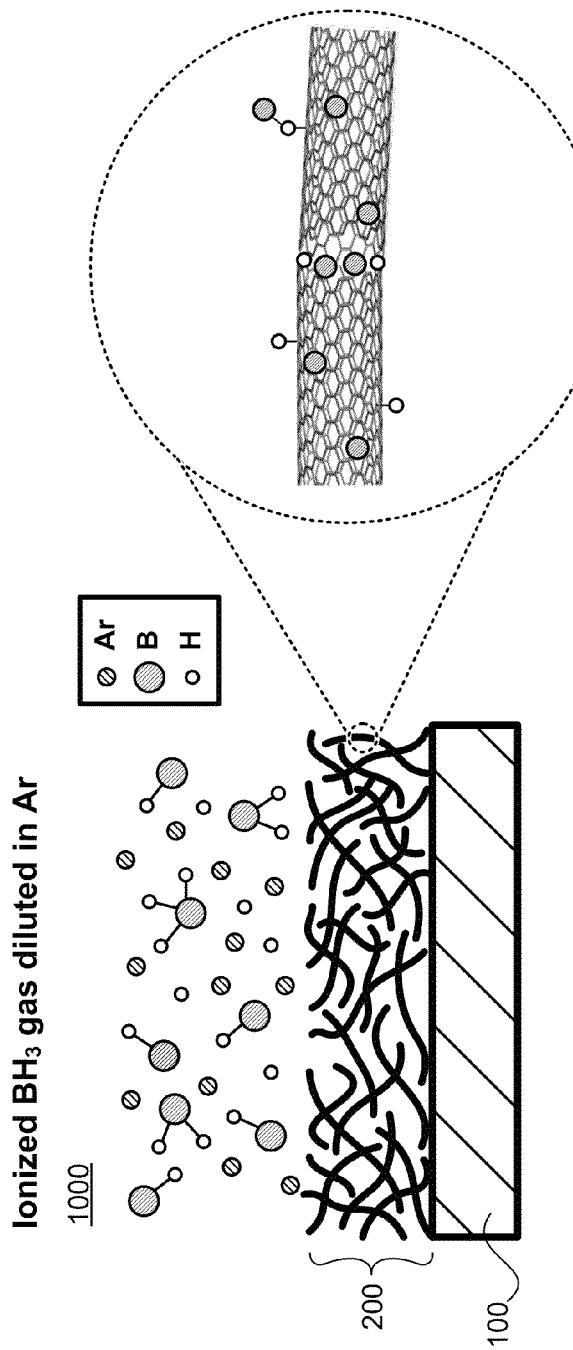
FIG. 12 illustrates an apparatus for functionalizing carbon nanotubes, in accordance with one embodiment consistent with the present disclosure.

FIGS. 10, 11, and 12, illustrate an apparatus 1000 for functionalizing carbon nanotubes. Referring now to FIG. 10, apparatus 1000 comprises a cryo-cooled/heated lower electrode structure 1010 (such an electrode structure may include, for example, a helium assisted heat transfer system), a sputter shield structure 1030, and a wafer clamping mechanism 1040. The apparatus 1000 further includes a high conductance pumping port 1020. A water-cooled RF coil antenna 1050 is situated around a tube structure 1060 (made from quartz or alumina, for example). Tube structure 1060 is further surrounded by an electrostatic shield 1090. A gas inlet 1080 is provided to allow for the axially symmetric distribution of ionized plasma gas (as discussed in more detail below), and viewport 1070 allows for optical emission spectroscopy or laser interferometry.

As shown in FIG. 10, apparatus 1000 may be an Inductive Coupled RF-Plasma (ICP) system, which produces ionized plasma gas of, for example, nitrogen ($N_2$), argon (Ar), oxygen ($O_2$), hydrogen ($H_2$), xenon difluoride ($XeF_2$), ammonia ($NH_3$), borane ($BH_3$), and boron triflouride ($BF_3$). In one embodiment, as shown in FIG. 11, ionized plasma gas of $XeF_2$ is produced by the ICP system operating at 13.56 MHz. In certain cases, the ionized plasma gas may be accelerated in a DC electric field such that the ions may acquire sufficient momentum to undergo physical interaction with carbon nanotubes. Carbon nanotubes of fabric layer 200 are then exposed to the ionized plasma gas, which interacts with the nanotubes chemically and/or physically. This technique can be used to functionalize and tailor the chemical composition of fabric layer 200 by attaching a wide variety of functional groups to the surface of carbon nanotubes within fabric layer 200. In certain embodiments, apparatus 1000 may be a commercially available plasma functionalization tool, manufactured by, for example, Applied Materials Inc., Lam Research Corp., Novellus Systems, Inc., Tegal Corp., Mattson Technology Inc., and Oxford Instruments PLC (Plasmalab).

The conductivity properties of fabric layer 200 after the functionalization treatment may depend on many plasma process parameters, including, but not limited to, the gas species (including dilution gases), underlying film(s), RF-plasma configuration and power, chamber pressure, substrate temperature, chamber configuration, DC bias control, and chamber temperature control. In one embodiment, as shown in FIG. 11, $XeF_2$ gas is ionized and carbon nanotubes of fabric layer 200 are exposed to the ionized $XeF_2$ gas. In this particular embodiment, fabric layer 200 is formed or coated on a wafer substrate 100, in which an underlying circuitry may have been formed previously. Depending on the plasma treatment process parameters, the $XeF_2$ treatment may functionalize sidewalls of the carbon nanotubes with fluorine 208, as depicted in FIG. 11, or introduce defects in the carbon nanotubes of fabric layer 200. The sidewall functionalizations and the introduction of defects may increase the disordering (i.e., a gain in $sp^3$ bonding) of the carbon nanotubes and/or decrease the conductivity of fabric layer 200, thereby allowing control over the resistivity operating window of a nonvolatile nanotube (NVNT) switch to be within its operating range. Although $XeF_2$ gas is discussed above as an example, it is to be understood that various other gas species may be used to plasma treat the carbon nanotubes of fabric layer 200.

In addition to directly treating the carbon nanotubes of fabric layer 200 with plasma, fabric layer 200, in a post plasma treatment, may be exposed to or treated with, for example, plasma reactive gases, thermally driven reactive gases, photochemically (e.g., ultraviolet) reactive gases, or wet chemistry. Such post plasma treatment of fabric layer 200 may introduce dopant species to react with the defects (dangling carbon bonds) created by the plasma treatment or further functionalize the sidewalls of the carbon nanotubes.

FIG. 12 illustrates an apparatus 1000 for functionalizing carbon nanotubes. In one embodiment, apparatus 1000 may include a plasma reactor. As shown in FIG. 12, a plasma treated fabric layer 200 is disposed in apparatus 1000 under a post plasma treatment environment. In this particular embodiment, fabric layer 200 is exposed to a borane ($BH_3$) gas introduced into the plasma reactor of apparatus 1000 after the $XeF_2$ plasma treatment as illustrated in FIG. 11. The $BH_3$ gas (typically diluted in an inert gas such as argon (Ar) or helium (He)) is ionized in the plasma reactor to form reactants, which interact with the dangling bonds of the carbon nanotubes at the defect sites and the open ends. That is to say the ionized $BH_3$ gas will include chemical structures (reactants) that will adhere to defect sites—which include dangling chemical bonds due to localized discontinuities in the hexagonal structure of the nanotubes—along nanotube elements throughout the nanotube fabric layer. As previously discussed, the presence of these chemical structures will disrupt the normal flow of electrons through the nanotube fabric layer, thereby limiting the lower end of the conductivity range (or, taken another way, increase the resistivity) of the nanotube fabric layer. In addition, the reactants may further functionalize the carbon nanotube sidewalls through a change in hybridization from $sp^2$ to $sp^3$ with simultaneous loss of conjugation of the sidewalls, as seen in the $XeF_2$ treatment. It is to be understood that the post plasma treatment process can be accomplished with sequential reactions driven by, for example, thermal, photochemical, and wet chemistry reactors.

The plasma chemistry functionalization embodiments described above are for illustrative and explanatory purposes only. It is not intended to be exhaustive nor to limit the scope of the present disclosure to the precise form of plasma chemistry disclosed. It is to be understood that modifications and/or variations are possible in light of the above disclosures, or may be acquired from practice of the embodiments. Accordingly, it is intended that the true scope of the present disclosure be defined by the appended claims and their equivalents.

Functionalization by CVD Treatment

In one embodiment, the conductivity of nanotube fabric layer 200 may be adjusted by the application of a chemical vapor deposition (CVD) of dielectric materials and/or doped filler materials. As with the wet chemistry coating technique discussed previously, such a CVD process will coat a portion—or, in some embodiments, substantially all—of the nanotube elements within nanotube fabric layer 200 with the dielectric and/or filler material. The carbon nanotubes may be coated by mixing or depositing a dielectric compound (e.g., $SiO_2$, silica, $Si_2N_3$, and other dielectric nanoparticles) to the carbon nanotubes prior to fabric formation. In addition, the carbon nanotubes may also be coated by depositing other dielectric filler materials using, for example, CVD techniques and/or photochemical (ultraviolet) deposition techniques.

To functionalize carbon nanotubes in a CVD treatment, numerous existing CVD devices may be used to expose fabric layer 200 with a variety of deposition gases. For example, the CVD device may be a low pressure CVD (LPCVD), an atmospheric CVD (APCVD), an atomic layer deposition CVD (ALD-CVD), a plasma enhanced CVD (PECVD), a high density plasma CVD (HDP-CVD), and/or a photochemical CVD. These CVD devices may be commercially available and manufactured by, for example, Applied Materials, Novellus, Tokyo Electron, and Kokusai Electric.

Figure 13:
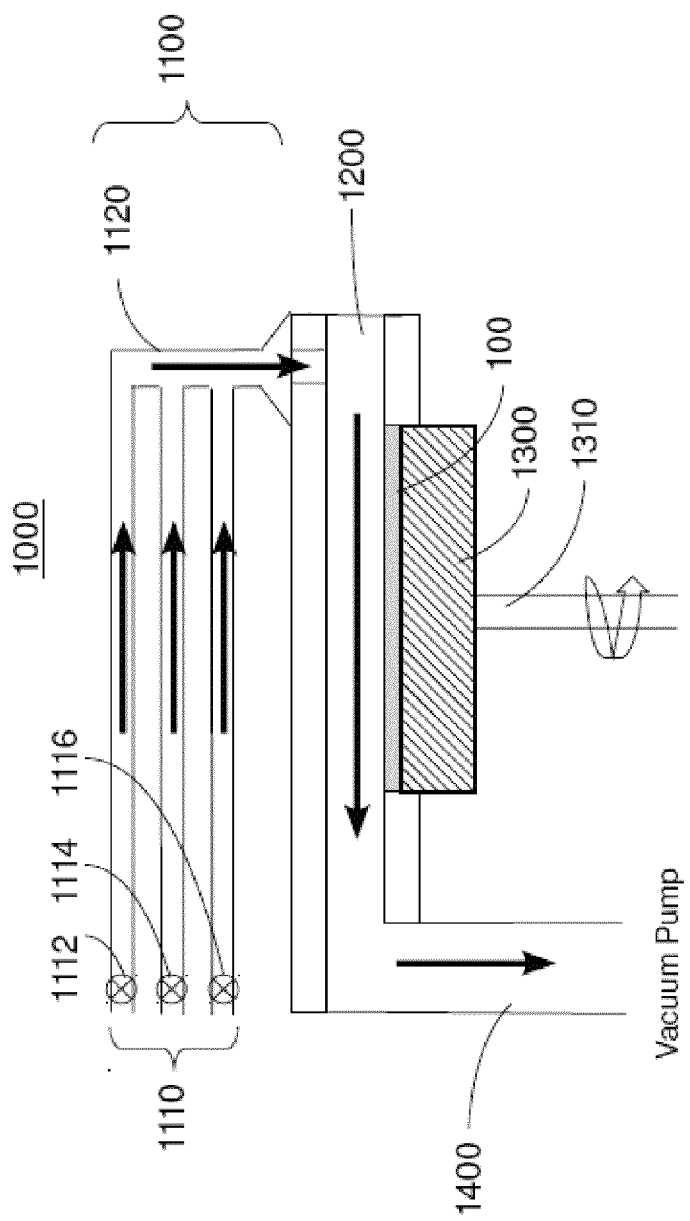
FIG. 13 illustrates an atomic layer deposition chemical vapor deposition (ALD-CVD) device in accordance with one embodiment consistent with the present disclosure.

Referring to FIG. 13, there is illustrated an ALD-CVD device 1000 in accordance with one embodiment consistent with the present disclosure. As shown, ALD-CVD device 1000 includes a gas inlet 1100, a chamber 1200 coupled with gas inlet 1100, a substrate holder 1300 for holding a substrate 100 in chamber 1200, and a gas outlet 1400 coupled with a vacuum pump to evacuate gas out of chamber 1200. Gas inlet 1100 may include a plurality of inlet ports 1110, each being controlled by one of valves 1112, 1114, and 1116, and a mixer 1120 coupled with inlet ports 1110 to mix different gases before injecting them into chamber 1200. In this particular embodiment, three inlet ports 1110 have been shown and described to simultaneously or alternately inject different species of gases into chamber 1200. It is to be understood that more or less than three inlet ports 1110 may be used. Substrate holder 1300 may include a rod 1310, which may lift substrate 100 into chamber 1200, rotate substrate 100 in chamber 1200, and/or move substrate 100 out of chamber 1200.

Before moving substrate 100 into chamber 1200, a fabric layer 200 (as shown in FIG. 11) is formed on substrate 100. Substrate 100 is then moved into chamber 1200. Carbon nanotubes of fabric layer 200 formed on substrate 100 are then exposed to precursors (such as, but not limited to $BBr_3$ and $H_2O$), which are alternately introduced in chamber 1200 through gas inlet 1110. As a result of the exposure, a monolayer of the precursors (or a fraction thereof) is physically adsorbed on surfaces of the carbon nanotubes. The sequential introduction of all precursors, separated by purge cycles, completes an ALD cycle.

One primary feature of ALD is that the adsorption of the precursors is self-limiting. That is, the adsorption will stop once the carbon nanotube surface is saturated with the adsorbed precursors. Because defect sites and other dangling carbon bonds are chemically more active, these sites are more likely to adsorb the initial precursor gases and to become a nucleation site for film growth. However, depending on the types of precursors and the process parameters, it is also possible for the precursors to attach to the pristine carbon nanotubes. Once the available adsorption sites are occupied, no further precursors may be adsorbed onto the carbon nanotubes of fabric layer 200.

In order for a reaction to exhibit ALD characteristics, the operating temperature of reactor or chamber 1200 must remain below that of the precursor decomposition threshold used in the reaction to maintain the self-limiting behavior. After a purge cycle by either evacuating reactor 1200 or purging reactor 1200 with an inert gas to remove the excess precursor from the initial cycle, the second precursor is introduced into reactor 1200 to react with the adsorbed precursor from the initial cycle. The final step in the ALD cycle is to purge or remove volatile reaction byproducts and excess precursor from reactor 1200. The final coating on the carbon nanotubes is achieved by repeating the ALD cycle until a desired thickness or functionalization is obtained.

Figure 14:
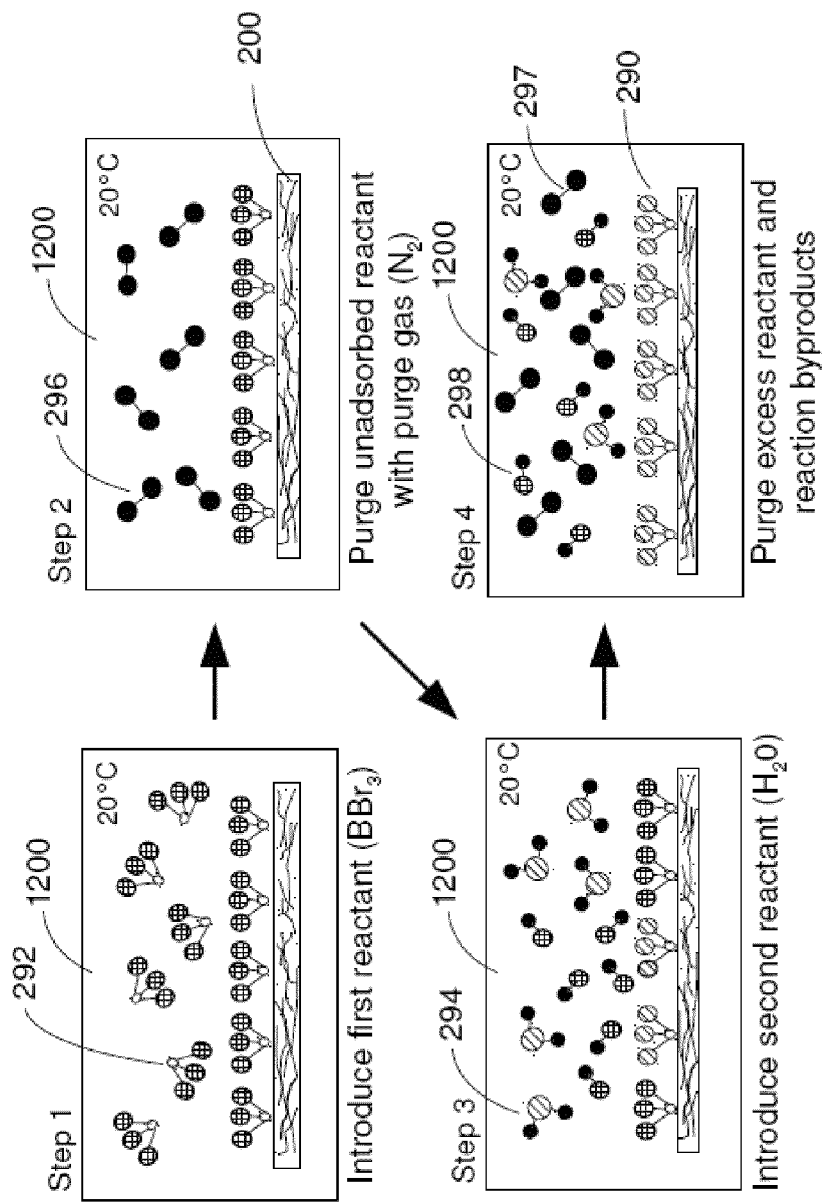
FIG. 14 illustrates an ALD-CVD process in accordance with one embodiment consistent with the present disclosure.

Referring to FIG. 14, there is illustrated an ALD-CVD process in accordance with one embodiment consistent with the present disclosure. In this particular embodiment, the ALD-CVD process deposits a diboron trioxide ($B_2O_3$) film at room temperature (i.e., a temperature ranging from about 20° C. to about 50° C.), using a first reactant 292 (e.g., $BBr_3$) and a second reactant 294 (e.g., $H_2O$) as precursors. The diboron trioxide ($B_2O_3$) film may be deposited on fabric layer 200 by performing and repeating an ALD cycle, which may include the following Steps 1-4.

In Step 1, first reactant 292 is introduced in chamber 1200 at room temperature. Some molecules of first reactant 292 are then adsorbed at available adsorption sites on the surface of the carbon nanotubes of fabric layer 200, while other molecules of first reactant 292 are not adsorbed. Next, in Step 2, a first purge gas 296 (e.g., $N_2$) is introduced in chamber 1200 to purge the unadsorbed first reactant 292 away from chamber 1200. Then, in Step 3, second reactant 294 is introduced in chamber 1200 to react with the adsorbed first reactant 292. The reaction byproducts include a deposited film 290 of $B_xO_y$, (actual stoichiometry will depend on the specific chemical bonding) remaining on the carbon nanotubes of fabric layer 200, and a gaseous byproduct 298 of HBr. Finally, in Step 4, a second purge gas 297 (e.g., $N_2$) is introduced in chamber 1200 to purge the gaseous byproduct 298 away from chamber 1200. This completes an ALD cycle of the ALD-CVD process. The final thickness of $B_2O_3$ deposited as a coating and/or a filler material will be determined in accordance with the number of ALD cycles performed and repeated. The ALD cycle may be repeated until a desired thickness and/or a desired functionalization are attained.

In addition to the growth of a $B_2O_3$ film, boron atoms may become available to react with the carbon nanotubes, especially at defect sites and nanotube open ends. Therefore, such boron atoms may also modify the conduction properties of the carbon nanotubes, in addition to the effects of dielectric coatings.

The CVD (particularly ALD-CVD) functionalization embodiments described above are for illustrative and explanatory purposes only. It is not intended to be exhaustive nor to limit the scope of the present disclosure to the precise CVD techniques and/or precursors disclosed. It is to be understood that modifications and/or variations are possible in light of the above disclosures, or may be acquired from practice of the embodiments. Accordingly, it is intended that the true scope of the present disclosure be defined by the appended claims and their equivalents.

Functionalization by Ion Implant

Another way to functionalize carbon nanotubes is to implant ions, within a nanotube fabric layer 200 so as to form defects along the surfaces of carbon nanotubes within the fabric layer 200. As a result, a portion of the carbon nanotubes may be damaged and changed from a very ordered structure ($sp^2$) with a high conductivity to a disordered structure ($sp^3$) with a low conductivity. As previously discussed, such defects may cause small disordered and localized structural changes in a portion of the carbon nanotubes, thereby impeding the flow of electrons through the nanotube fabric layer 200 and limiting the conductivity of the nanotube fabric layer. These ions can be inert gas ions, such as Helium ($He^+$), Neon ($Ne^+$), Argon ($Ar^+$), Krypton ($Kr^+$), or Xeon ($Xe$) ions.

Figure 15:
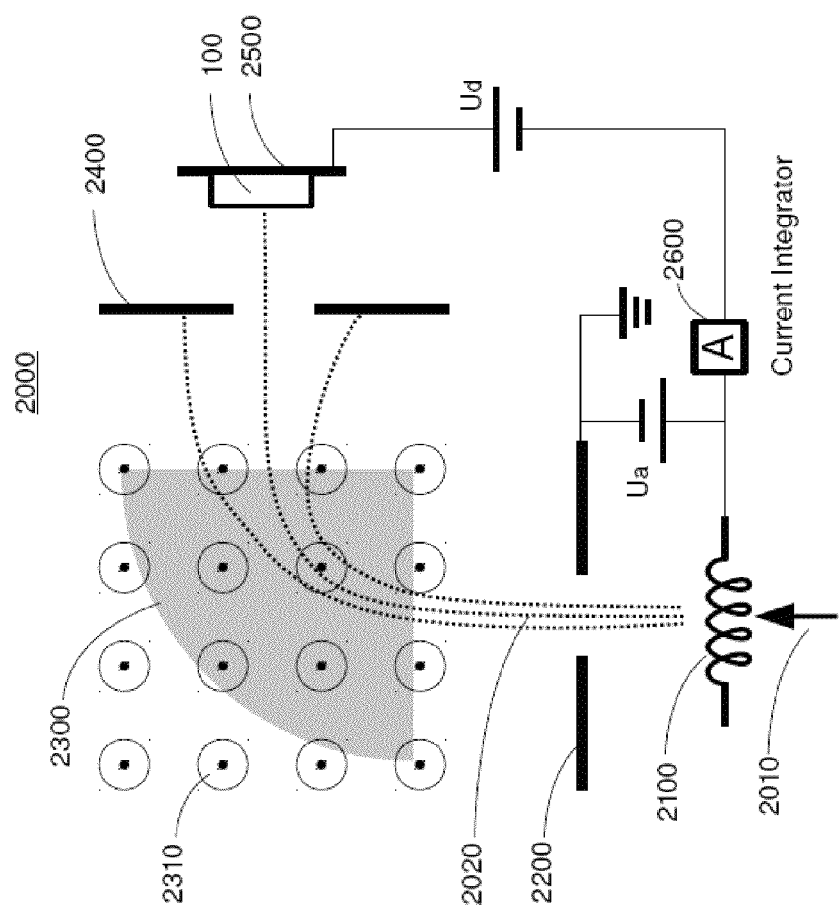
FIG. 15 illustrates an ion implantation device in accordance with one embodiment consistent with the present disclosure.

Referring to FIG. 15, there is illustrated an ion implantation device 2000 in accordance with one embodiment consistent with the present disclosure. To implant ions in substrate 100, on which fabric layer 200 may have been formed, an elemental source 2010 (e.g., an inert gas) is introduced to an ion producing coil 2100, which energizes elemental source 2010 and produces ions therefrom. The produced ions are then accelerated by applying a voltage difference $U_a$ and the accelerated ions form a plurality of ion beams 2020. Only those ion beams 2020 that pass through an extraction slit 2200 may enter into a magnetic region 2300. Because ion beams 2020 are electrically charged, magnetic field 2310 in magnetic region 2300 may deflect ion beams 2020 based on, for example, their masses, velocities, and/or charges. By using a mass analyzing slit 2400, ion beams 2020 of high purity may be extracted from a less pure ion source. After the ionization, extraction, and mass analysis of elemental source 2010, ion beams 2020 may be accelerated or de-accelerated by adjusting voltage differences $U_a$ and/or $U_d$. Consequently, ion implantation device 2000 may provide ion beams 2020 of desired energy to impinge in target materials, such as the carbon nanotubes of fabric layer 200.

In order to uniformly implant ions into the target materials, ion beams 2020 may scan across the target materials by, for example, an electrostatic technique, a magnetic technique, a mechanical technique, or a combination thereof. In addition, neutral ions (i.e., ions that are charge neutral) previously included in ion beams 2020 may be removed from ion beams 2020 by using deflection techniques (e.g., electrostatic and/or magnetic techniques), before ion beams 2020 strike the target materials. Further, the dosage of implanted ions (i.e., the number of ions implanted per unit area, ions/$cm^2$) in the target materials may be measured by using a Faraday cup detector mounted before the target materials, or an off-set cup mounted behind the target materials. Given the species, energy, and dosage of the implanted ions, one may easily specify and adjust the concentration, depth, and uniformity of ions implanted in the target materials.

As previously discussed within the present disclosure, it is desirable—within certain applications—to reliably control both the density and uniformity of defects within a nanotube fabric layer. That is, the density of defects within a nanotube fabric layer will tend to limit the lower end of the conductivity range of a nanotube fabric layer. And, further, the uniformity of defects will tend to provide uniform operation of devices (two-terminal nanotube switching elements, for example) fabricated with such fabric layers (each "section" of a nanotube fabric layer might be expected to include a certain range of defects, for example). As such, the ion implant techniques are well suited within certain applications to realize a nanotube fabric layer comprising nanotube defects in a preselected density and/or uniformity.

Figure 16:
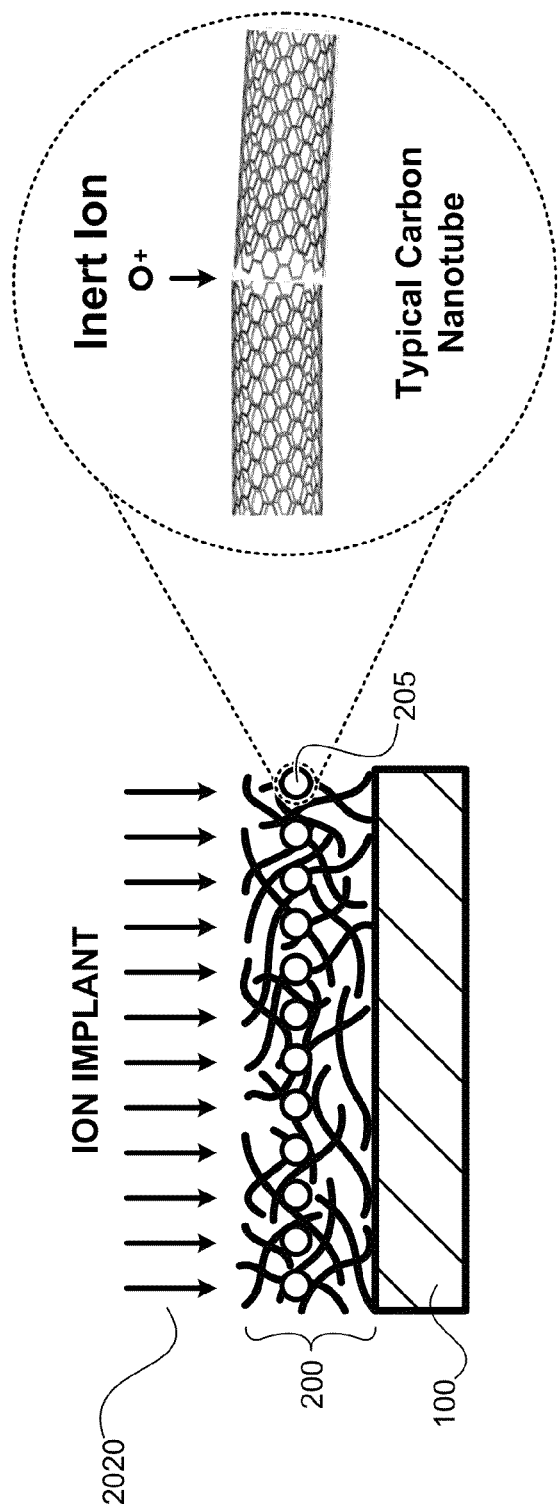
FIG. 16 illustrates ion implantation at a direct angle, in accordance with one embodiment consistent with the present disclosure.
Figure 17:
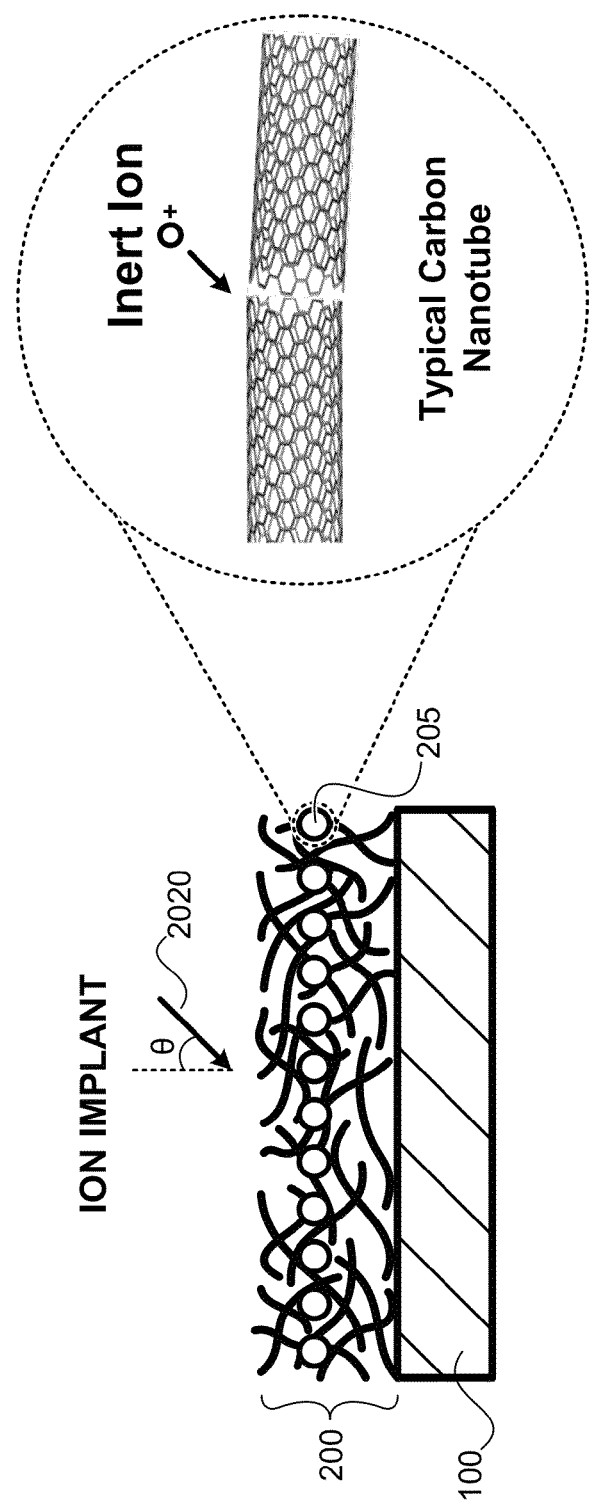
FIG. 17 illustrates ion implantation at a tilted angle, in accordance with one embodiment consistent with the present disclosure.

Referring to FIGS. 16 and 17, there is illustrated an ion implantation process for fabric layer 200, in accordance with embodiments consistent with the present disclosure. In these particular embodiments, carbon nanotubes of fabric layer 200 are the target materials. The desired ion dosage in fabric layer 200 depends on the ion species, density and thickness of fabric layer 200, ion energy, and/or the incident angle of ion beams 2020. As shown in FIG. 16, the incident angle of ion beams 2020 is a direct angle (zero degrees), namely, perpendicular to an upper surface of fabric layer 200. In certain embodiments, the incident angle of ion beams 2020 may be greater than zero degrees, as shown in FIG. 17. Typically, the carbon nanotubes of fabric layer 200 have implant characteristics similar to those of polymers, such as photoresists used in semiconductor lithography processes.

Referring again to FIGS. 16 and 17, to form defects in fabric layer 200 within a thickness range 205 of about 200 Å to about 800 Å, an ion dosage of about $10^{10}$ to about $10^{13}$ ions/cm$^2$ may be used to produce a defect density of about $10^{14}$ to $10^{17}$ defects/cm$^3$ in fabric layer 200. For example, for a bit cell having an area of about 900 nm$^2$, this translates into a dosage of about 1 to 1000 defects per bit, with a probability of about 10% to form a defect. To increase the probability of defect formation, the ion implant can be done at an incident angle greater than zero degrees, as illustrated in FIG. 17. It is to be understood that, to achieve the desired cell switching characteristics, the actual per-bit defect level may be determined by standard practices using Design of Experiments (DOE) methodology.

Although FIGS. 16 and 17 illustrate that ions are implanted into fabric layer 200 directly without overlying layers, it is to be understood that ions may be implanted in fabric layer 200 indirectly, namely, through one or more overlying layers. This may be required, for example, to support a manufacturing process where it might be difficult or otherwise inconvenient to apply an ion implant of a nanotube fabric layer prior to the application of one or more overlying layers. For example, in one embodiment, an upper electrode or other layers may be formed on fabric layer 200 prior to implanting ions. Ions may still be implanted to the desired thickness range of fabric layer 200 by properly adjusting the implant parameters, such as the ion energy.

Figure 18:
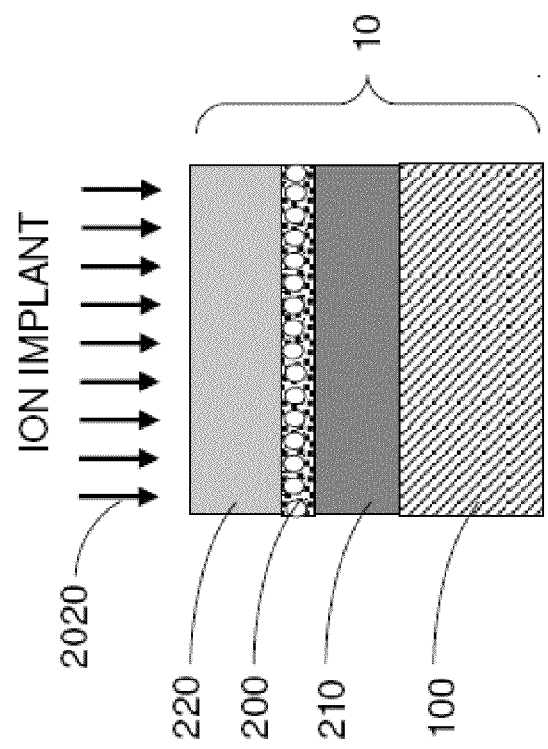
FIG. 18 illustrates a semiconductor device having a carbon nanotube fabric layer, on which an ion implantation process is performed, in accordance with one embodiment consistent with the present disclosure.

For example, referring to FIG. 18, there is illustrated a semiconductor device 10, in accordance with one embodiment consistent with the present disclosure. Semiconductor device 10 includes a carbon nanotube fabric layer 200 and a top electrode 220 formed on fabric layer 200. A plurality of ion beams 2020 may impinge on semiconductor device 10 to implant ions in fabric layer 200 through top electrode 220. The implant parameters, such as the ion energy and/or the ion species, may be adjusted to implant ions at a depth close to the center of fabric layer 200. That is, the ions are implanted in fabric layer 200 at a location about equally spaced from top electrode 220 and bottom electrode 210. Top electrode 220 may comprise metallic elements, such as W, Pd, Pt, Cu, Al, and the like, or conducting materials, such as TiN, TaN, WN, and the like.

Figure 19:
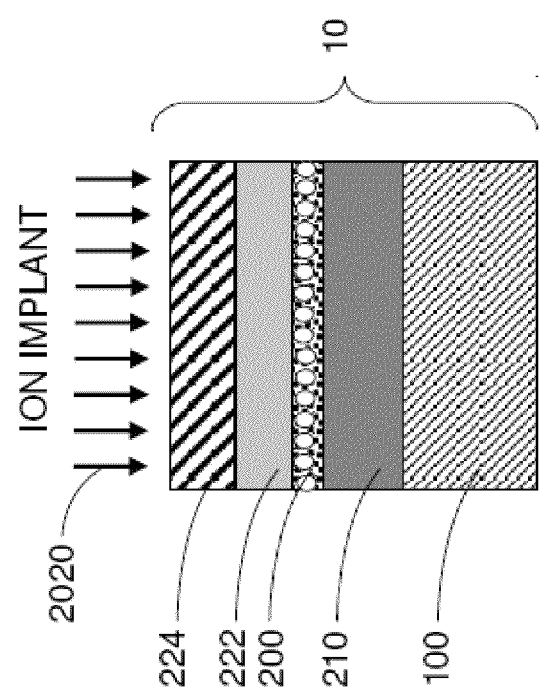
FIG. 19 illustrates a semiconductor device having a carbon nanotube fabric layer, on which an ion implantation process is performed, in accordance with one embodiment consistent with the present disclosure.

For example, referring to FIG. 19, there is illustrated a semiconductor device 10 in accordance with one embodiment consistent with the present disclosure. Semiconductor device 10 includes a carbon nanotube fabric layer 200, a first top electrode 222 formed on fabric layer 200, and a second top electrode 224 formed on first top electrode 222. A plurality of ion beams 2020 may impinge on semiconductor device 10 to implant ions in fabric layer 200 through the bi-layer structure of first top electrode 222 and second top electrode 224, where second top electrode 224 is used as a capping layer. The implant parameters, such as the ion energy and/or the ion species, may be adjusted to implant ions at a depth close to the center of fabric layer 200, as discussed above with respect to FIG. 18.

Figure 20:
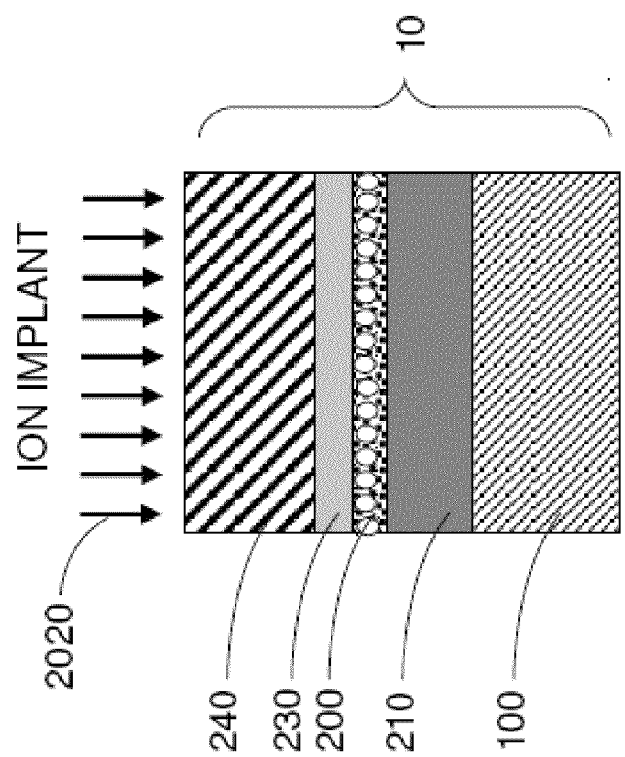
FIG. 20 illustrates a semiconductor device having a carbon nanotube fabric layer, on which an ion implantation process is performed, in accordance with one embodiment consistent with the present disclosure.

For example, referring to FIG. 20, there is illustrated a semiconductor device 10 in accordance with one embodiment consistent with the present disclosure. Semiconductor device 10 includes a carbon nanotube fabric layer 200, a barrier layer 230 formed on fabric layer 200, and a capping layer 240 formed on barrier layer 230. Barrier layer 230 may be a thin layer of barrier metal, such as TiN, WN, TaN, and the like, while capping layer 240 may be a thick metal layer. Barrier layer 230 may be used to set contact resistance and to prevent penetration of metal from capping layer 240 into fabric layer 200.

Figure 21:
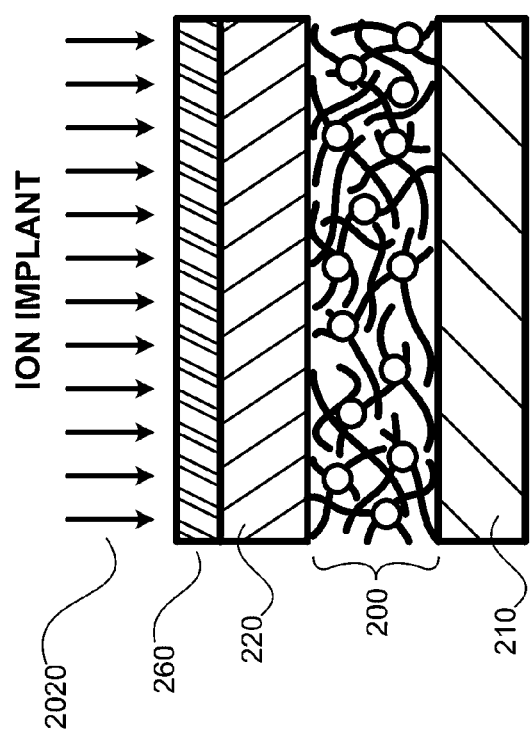
FIG. 21 illustrates a semiconductor device having a dielectric filled fabric layer, on which an ion implantation process is performed, in accordance with one embodiment consistent with the present disclosure.

In one embodiment, dielectric materials may be used to form overlying layers on fabric layer 200 prior to implanting ions in fabric layer 200. As shown in FIG. 21, a dielectric layer 260 is formed on top electrode 220 before ion beams 2020 are directed to fabric layer 200. The ion implant parameters may be adjusted so as to implant ions at a location close to the center of fabric layer 200.

Figure 22:
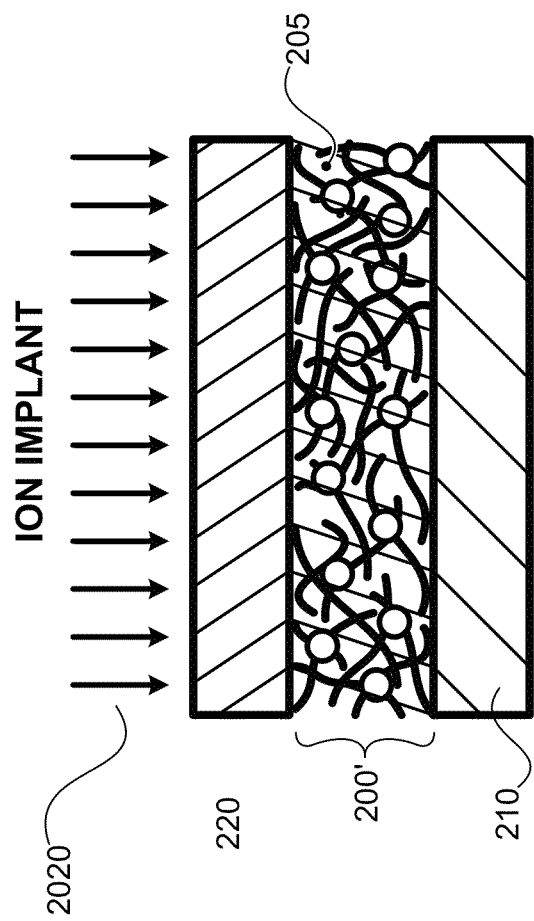
FIG. 22 illustrates a semiconductor device having a dielectric filled fabric layer, on which an ion implantation process is performed, in accordance with one embodiment consistent with the present disclosure.

In one embodiment, a carbon nanotube fabric layer may be filled with a filler material, such as a dielectric material, prior to implanting ions in the fabric layer. As shown in FIG. 22, a carbon nanotube fabric layer is formed on a bottom electrode 210 and the carbon nanotube fabric layer is filled with a dielectric material 205, so as to form a dielectric filled fabric layer 200'. In this particular embodiment, the dielectric material comprises silicon dioxide (SiO$_2$). Next, a top electrode 220 is formed on dielectric filled fabric layer 200' before ion implantation. Again, the implant parameters may be adjusted so as to implant ions at a location close to the center of dielectric filled fabric layer 200'.

As discussed above, a filler material may be a dielectric material, which can be used to prevent electrical shorting in a switch or a memory circuit. For example, the use of a filler material may limit penetration of metallic or dielectric materials during the deposition of top electrode 220 and/or the deposition of a sidewall dielectric material. The use of a filler material may also improve the structural integrity of the carbon nanotube fabric layer. Further, the use of a filler material may modify the switching properties of the carbon nanotubes, depending on the specific filler material used. In certain embodiments, ion implantation of inert and/or chemically active ion species discussed above may be used to implant ions into a carbon nanotube fabric layer having a filler material incorporated therein. The filler material may be a dielectric material, such as SiO$_2$ or Silica, doped oxide, such as phosphorous silicate glass (PSG) or boro silicate glass (BSG), a semiconducting material, such as Si or Ge, or an organic material, such as a photoresist material that may be subsequently removed after the formation of electrodes and/or sidewalls.

By incorporating an ion implantation technique with appropriate ion species, ion energy, and/or ion dosage, it is possible to introduce defects into a nanotube fabric layer uniformly across the fabric layer at a required defect density. It is important that this ion implantation technique not create a complete or near complete amorphization of the carbon nanotube fabric layer. Rendering all—or nearly all—of the carbon nanotubes within a nanotube fabric layer (or, in some applications, within a certain area of a nanotube fabric layer) into amorphous carbon could significantly impede the switching function of the nanotube fabric layer. Those skilled in the ion implantation art can control the ion dose rate and/or other ion implant control parameters to achieve the desired defect density and to prevent amorphorization. There are numerous commercially available ion implant tools that can be used for this purpose. Some of the commercially available ion implant tools are manufactured by, for example, Varian Semiconductor Equipment (Gloucester, Mass.), Axcelis (Beverly, Mass.), and Nissin Electric (Kyoto, Japan).

Although inert gas ions are used in the embodiments discussed above to produce defects in carbon nanotubes in a controlled manner, it is possible to use chemically reactive ions to not only induce defects as done with inert ions, but also produce chemically reactive bonding with the unbonded carbon induced at the defect sites or at the functionalized sidewalls. The use of chemically reactive ions may further modify the conductivity and switching properties of the carbon nanotubes. With proper implant parameters and anneal characteristics, the chemically reactive ion species can replace carbon atoms in the $sp^2$ matrix of the carbon nanotubes, thereby shifting the conduction characteristics of the carbon nanotubes around the substitutional site by disrupting the aromatic conjugate systems, reducing the number of $\pi$ electrons, and increasing the resistance of the carbon nanotube as previously discussed. The chemically reactive ion species can modify both the switching properties and the conductivity of the ion implanted carbon nanotube through structural and/or chemical modifications. Although not inclusive, examples of chemically active ions (or dopants) include atomic species, such as $N^+$, $F^+$, $B^+$, $P^+$, $As^+$, and $Sb^+$, molecular species, such as $BF_2^+$, $B_{10}H_{14}^+$, $PF_3^+$, and $AsF_3^+$, or any other ion implant species commonly used in the semiconductor industry to modify the band structure and conductivity of silicon.

Figure 23:
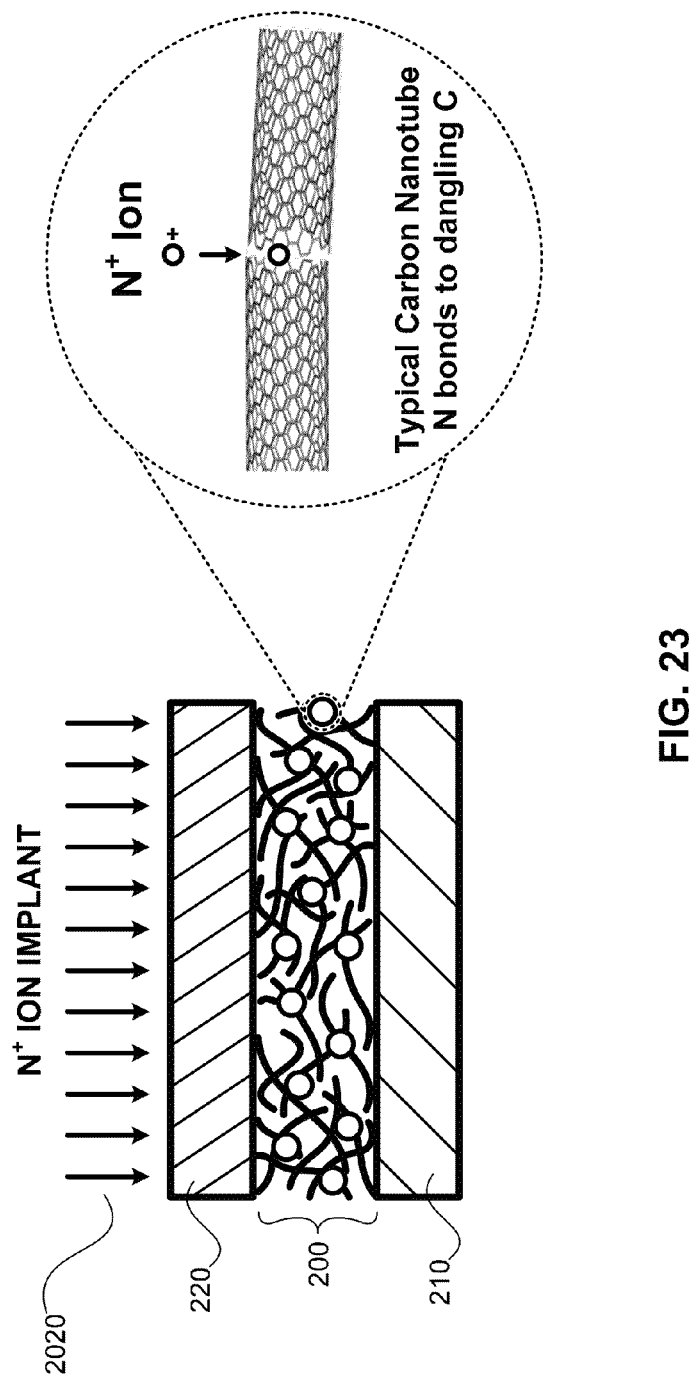
FIG. 23 illustrates the modification of carbon nanotubes by an ion implant, in accordance with one embodiment consistent with the present disclosure.

Implanting chemically reactive ion species may require a post thermal anneal following the ion implant to activate the chemical bonding of the chemically reactive ion species with carbon (C) and to stabilize the structure of carbon nanotubes. Referring to FIG. 23, there is illustrated an ion implantation to modify carbon nanotubes with $N^+$ (or $N_2^+$) ions, followed by a post implant anneal. In this particular embodiment, $N^+$ implant parameters may include a dosage of about $2\times10^{15}$ ions/cm$^2$, an ion implant energy of about 6 KeV, and an incident tilt angle of about 7 degrees. With these ion implant parameters, the $N^+$ ions may be placed and distributed in fabric layer 200 at a thickness of about 380 Å. In this particular embodiment, fabric layer 200 has a total thickness of about 600 Å.

The $N^+$ ions may functionally modify one or more of the dangling carbon atoms, which may then be available to modify the conduction and switching properties of a nanotube fabric layer during switching from a low conductivity state to a high conductivity state, and vice versa. The chemically reactive species may be chemically active atomic ions, such as $B^+$, $F^+$, $P^+$, $As^+$, $Sb^+$, and the like, or chemically active molecular ions, such as $N_2^+$, $BF_2^+$, $BH_3^+$, $PH_3^+$, and the like.

Figure 24:
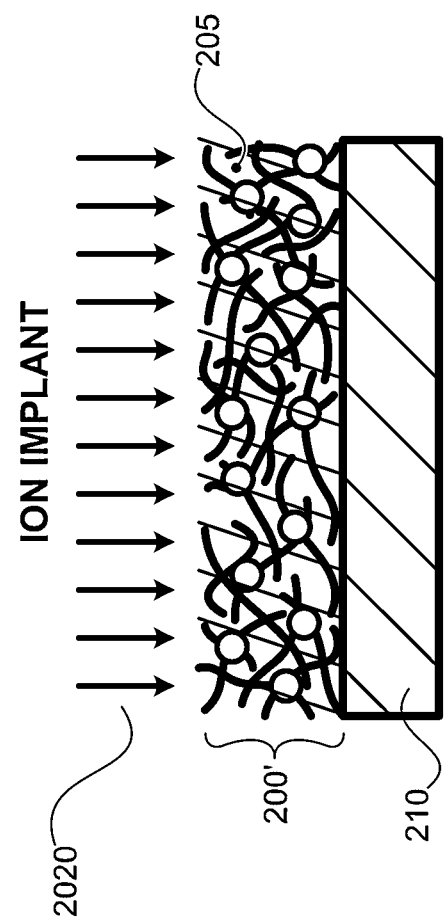
FIG. 24 illustrates a semiconductor device having a composite layer, in which ions are implanted, in accordance with one embodiment consistent with the present disclosure.
Figure 25:
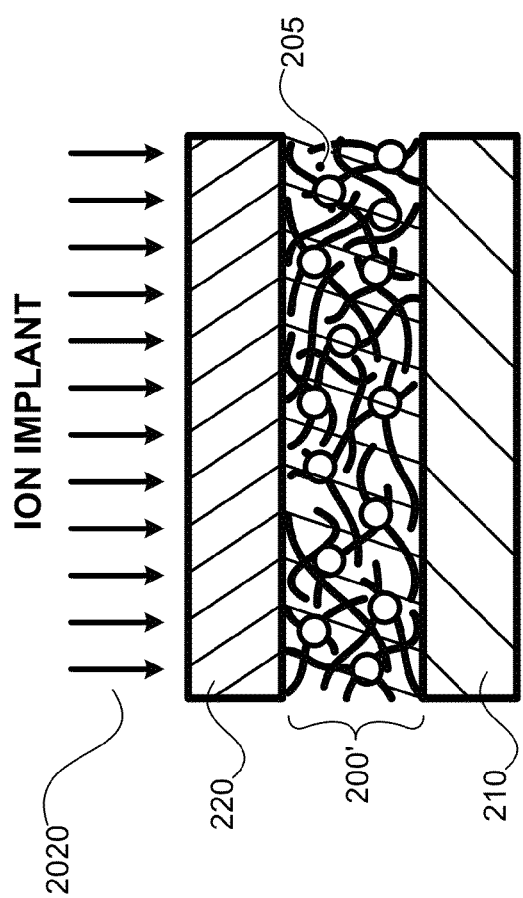
FIG. 25 illustrates a semiconductor device having a composite layer, in which ions are implanted through an overlying layer, in accordance with one embodiment consistent with the present disclosure.

Referring to FIG. 24, there is illustrated a composite layer 200' (which, as in FIG. 22, includes a filler material 205) with ion beams 2020 directly implanting ions in composite layer 200'. In one embodiment, composite layer 200' may include a fabric layer of carbon nanotubes and a filler material incorporated with the carbon nanotubes. If needed, the ion implant may be performed after an overlying electrode layer 220 (or layers) is formed on composite layer 200', as shown in FIG. 25. To implant ions through overlying electrode layer 220, the ion energy may be adjusted to realize an increased straggle (the standard deviation of the implant's projected range) of the implant. Various types or species of ions may be used to implant composite layer 200'. For example, chemically inactive (inert) ions, such as $He^+$, $Ar^+$, $Ne^+$, $Kr^+$, or $Xe^+$, or chemically active ions may be used. The implanted ions may form defects in the carbon nanotubes of composite layer 200'. As previously discussed, the defects may form either reversible switching sites or irreversible low conductivity states that can be useful to maintain the base SET 1 resistivity of the switch. If the implanted ion is chemically active, e.g., the common dopant species $N^+$, $B^+$, $P^+$, and $As^+$, the implanted species will be available to bond or functionalize the carbon at the defect sites, thereby modifying the conduction and/or switching properties of the switch.

In addition to modifying the nanotube fabric layer 200 or composite layer 200' (which, as shown in FIGS. 22, 24, and 25, includes a filler material 205 in addition to nanotube elements), an ion implantation process with appropriate implant parameters (e.g., ion energy, species, and dosage) may be performed to modify the interface between fabric layer 200 or composite layer 200' and metal electrodes that contact the fabric. Ions implanted into these interface regions can modify the contact characteristics of layers 200 or 200' and electrodes 210 or 220. One embodiment consistent with the present disclosure is to lower the contact resistance so as to increase the drop of voltage applied to the cell within the nanotube fabric and not at the electrode interfaces.

Figure 26:
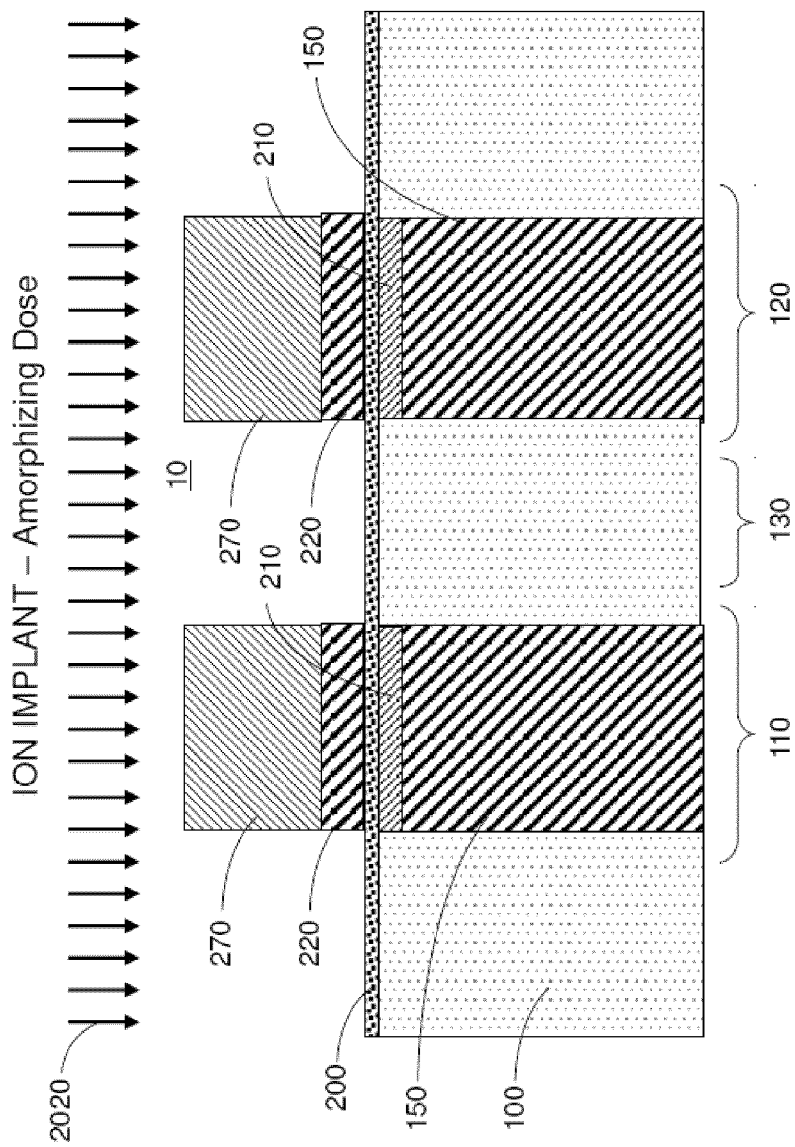
FIG. 26 illustrates a semiconductor device including a plurality of cell regions, in accordance with one embodiment consistent with the present disclosure.

Referring to FIG. 26, there is illustrated a semiconductor device 10 including a plurality of cell regions 110 and 120, which are separated by an isolation region 130. In some embodiments, cell regions 110 and 120 may constitute bits of a memory device. Although only two cell regions 110 and 120 are shown and described, it is to be understood that semiconductor device 10 may include billions or more cell regions.

As shown in FIG. 26, semiconductor device 10 includes a substrate 100, in which metal plugs 150 are embedded in via holes of substrate 10. In addition, bottom electrodes 210 of cell regions 110 and 120 are also embedded in via holes of substrate 100 and are formed on metal plugs 150. In this embodiment, bottom electrodes 210 are in dielectric isolation with each other. In other embodiments, bottom electrodes 210 may be electrically coupled with each other.

As shown in FIG. 26, carbon nanotube fabric layer 200 may be formed on an upper surface of substrate 100 and bottom electrodes 210. In one embodiment, the upper surface may be planarized before the formation of fabric layer 200, such that substrate 100 level with bottom electrodes 210. In some embodiments, fabric layer 200 may be a composite layer 200' that includes filler materials as discussed above.

Referring again to FIG. 26, semiconductor device 10 further includes top electrodes 220 on fabric layer 200. One of top electrodes 220 may correspond to one of cells 110 and 120. Moreover, a mask layer 270 may be formed on top electrodes 220 to cover a portion of fabric layer 200 below top electrodes 220. In one embodiment, top electrodes 220 may be formed by depositing a metal layer on fabric layer 200 and then patterning the metal layer in accordance with mask layer 270. It is to be understood that top electrodes 220 may be formed by using other mask patterns. Further, in one embodiment, mask layer 270 may be used to prevent ions from penetrating into fabric layer 200 in cell regions 110 and 120. By using appropriate ion implant parameters and by masking cell regions 110 and 120, ions may be implanted into a portion of fabric layer 200 in isolation region 130. This causes the portion of fabric layer 200 in isolation region 130 to convert from a low resistivity state to a high resistivity state (irreversible carbon nanotube defects), or a dielectric-like region. In this scenario, dielectric-like regions formed by the ion implantation are self-aligned to the memory cell elements, and are left in place. Accordingly, in this particular embodiment, no dielectric fill process is required in the fabrication of memory devices.

Such a technique (that is, applying an ion implant over a masked nanotube fabric layer) could be used, for example, to realize essentially non-conducting isolation structures within a nanotube fabric layer without the need for etching the nanotube fabric layer. Such isolation structures could be used, for example, to electrically isolate different switching elements within a nanotube fabric based resistive change memory array. In another example, such isolation structures could be used, for example, to realize a network of essentially electrically isolated conductive traces through the nanotube fabric layer (useful, for example, for the interconnections within an electrical circuit). Within certain applications, the use of a masking layer to render only certain regions of a nanotube fabric layer into these isolation structures may provide a simplified fabrication process and, in some aspects, allow for the fabrication of isolated devices on a smaller scale than would be possible with conventional etching techniques. Further, as such techniques allow for the creation of isolation structures within a nanotube fabric layer (that is, regions of the nanotube fabric layer are rendered into essentially non-conducting structures), devices (or arrays of devices) employing such nanotube fabric layers can be, in some examples, realized over flexible substrates.

Further, such techniques can be employed to form multi-layer structures. Within such structures, a first nanotube fabric layer is formed, masked, and then subjected to ion implantation in a first operation. In a second operation a second nanotube fabric layer is then formed over the first nanotube fabric layer. This second nanotube fabric layer can then be masked and subjected to ion implantation. In this way, regions of each nanotube fabric layer can be rendered into isolation structures separately, providing a stacked structure comparing individually patterned nanotube fabric structures. In some aspects, these multiple nanotube fabric layers may be formed with isolating layers between them. Such isolating layers may include, but are not limited to, nanotube fabric layers rendered essentially non-conducting via the methods of the present disclosure.

The ion implantation embodiments described above are for illustrative and explanatory purposes only. It is not intended to be exhaustive nor to limit the scope of the present disclosure to the precise ion implantation techniques disclosed. It is to be understood that modifications and/or variations are possible in light of the above disclosures, or may be acquired from practice of the embodiments. Accordingly, it is intended that the true scope of the present disclosure be defined by the appended claims and their equivalents.

What is claimed is:

1. A method for adjusting the conductivity range of a nanotube fabric layer, comprising:
   forming a nanotube fabric layer on a substrate, said nanotube fabric layer comprising a plurality of nanotube elements and having an electrical resistance, wherein said electrical resistance of said nanotube fabric layer is capable of being switched among a plurality of non-volatile resistive states responsive to an applied electrical stimulus, said plurality of non-volatile resistive states falling within a conductivity range characterized by a lower limit and an upper limit; and
   functionalizing at least a portion of said plurality of nanotube elements within said nanotube fabric layer to adjust at least one of said lower limit and said upper limit of said conductivity range of the nanotube fabric.

2. The method of claim 1 wherein said step of functionalizing decreases said upper limit of said conductivity range.

3. The method of claim 1 wherein said step of functionalizing increases said lower limit of said conductivity range.

4. The method of claim 1 wherein said step of functionalizing increases said upper limit of said conductivity range.

5. The method of claim 1 wherein said step of functionalizing decreases said lower limit of said conductivity range.

6. The method of claim 1 wherein said step of functionalizing increases the uniformity of said conductivity range.

7. The method of claim 1 wherein said step of functionalizing introduces at least one irreversible defect within said nanotube fabric layer.

8. The method of claim 1 wherein said step of functionalizing introduces at least one switching site within said nanotube fabric layer.

9. The method of claim 1 wherein said step of functionalizing eliminates at least one switching site within said nanotube fabric layer.

10. The method of claim 1 wherein said step of functionalizing comprises dispersing a filler material over said nanotube fabric layer such that said filler material penetrates through at least a portion of said nanotube fabric layer.

11. The method of claim 10 wherein said filler material penetrates through substantially all of said nanotube fabric layer.

12. The method of claim 10 wherein said filler material is one selected from the group consisting of silicon dioxide, silica, and silicon nitride.

13. The method of claim 10 wherein dispersing said filler material comprises dispersing ions of an inert gas.

14. The method of claim 13 wherein said inert gas is one selected from the group consisting of helium, neon, argon, krypton, and xenon.

15. The method of claim 10 wherein dispersing said filler material comprises dispersing ions of a chemically reactive substance.

16. The method of claim 15 wherein said chemically reactive substance is one selected from the group consisting of nitrogen, fluorine, boron, phosphorous, arsenic, and antimony.

17. The method of claim 10 wherein dispersing said filler material comprises performing a chemical vapor deposition process.

18. The method of claim 17 wherein said chemical vapor deposition process is one of a low pressure chemical vapor deposition (LPCVD) process, an atmospheric chemical vapor deposition (APCVD) process, an atomic layer deposition chemical vapor deposition (ALD-CVD) process, a plasma enhanced chemical vapor deposition (PECVD) process, a high density plasma chemical vapor deposition (HDP-CVD) process, or a photochemical chemical vapor deposition process.

19. The method of claim 1 wherein said step of functionalizing comprises dispersing a gas over said nanotube fabric layer.

20. The method of claim 19 wherein said gas is one selected from the group consisting of nitrogen and argon.

21. The method of claim 1 wherein said step of functionalizing comprises implanting ions of an inert gas.

22. The method of claim 21 wherein said inert gas is selected from the group consisting of helium, neon, argon, krypton, and xenon.

23. The method of claim 1 wherein said step of functionalizing comprises implanting ions of a chemically reactive substance.

24. The method of claim 23 wherein said chemically reactive substance is an atomic substance selected from the group consisting of nitrogen, fluorine, boron, phosphorous, arsenic, and antimony.

25. The method of claim 23 wherein said chemically reactive substance is a molecular substance selected from the group consisting of $N_2$, $BF_2$, $BH_3$, $PH_3$, and $AsH_3$.

26. The method of claim 23 further comprising annealing said nanotube fabric layer subsequent to implanting said ions of a chemically reactive substance.

27. The method of claim 26 wherein said step of annealing activates chemical bonding between said plurality of nanotube elements and said chemically reactive substance.

28. The method of claim 1 wherein said step of functionalizing comprises introducing defects to at least one pre-selected region within said nanotube fabric layer.

29. The method of claim 28 wherein said at least one pre-selected region is electrically insulating.

30. The method of claim 28 wherein said at least one pre-selected region isolates at least two other regions within said nanotube fabric layer.

31. The method of claim 1 wherein said step of forming comprises depositing said plurality of nanotube elements on said substrate via one of a spin coating process, a spray coating process, a dip coating process, a silk screen printing process, or a gravure printing process.

32. The method of claim 1 wherein said plurality of nanotube elements are carbon nanotubes.

33. The method of claim 1 wherein said plurality of nanotube elements are single walled nanotubes.

34. The method of claim 1 wherein said plurality of nanotube elements are multi walled nanotubes.

35. A method for forming a nanotube fabric layer, comprising:
functionalizing a plurality of nanotube elements;
disposing said functionalized plurality of nanotube elements on a substrate to form a nanotube fabric layer having an electrical resistance, wherein said electrical resistance of said nanotube fabric layer is capable of being switched among a plurality of non-volatile resistive states responsive to an applied electrical stimulus, said plurality of non-volatile resistive states falling within a conductivity range characterized by a lower limit and an upper limit; and
wherein said functionalizing limits at least one of said lower limit and said upper limit of said conductivity range of the nanotube fabric.

36. The method of claim 35 wherein said functionalizing decreases said upper limit of said conductivity range.

37. The method of claim 35 wherein said functionalizing increases said lower limit of said conductivity range.

38. The method of claim 35 wherein said functionalizing increases said upper limit of said conductivity range.

39. The method of claim 35 wherein said functionalizing decreases said lower limit of said conductivity range.

40. The method of claim 35 wherein said step of functionalizing increases the uniformity of said conductivity range.

41. The method of claim 35 wherein said step of functionalizing introduces at least one irreversible defect within said nanotube fabric layer.

42. The method of claim 35 wherein said step of functionalizing introduces at least one switching site within said nanotube fabric layer.

43. The method of claim 35 wherein said step of functionalizing eliminates at least one switching site within said nanotube fabric layer.

44. The method of claim 35 wherein said step of functionalizing comprises exposing said plurality of nanotube elements to a gas.

45. The method of claim 44 wherein said gas is one selected from the group consisting of nitrogen and argon.

46. The method of claim 35 wherein said step of functionalizing comprises combining a plurality of nanoscopic particles with said plurality of nanotube elements.

47. The method of claim 46 wherein said nanotube fabric layer comprises a mixture of said plurality of nanotube elements and said plurality of nanoscopic particles.

48. The method of claim 46 wherein said plurality of nanoscopic particles is one selected from the group consisting of silicon dioxide, silica, and silicon nitride.

49. The method of claim 35 wherein said step of disposing comprises depositing said plurality of nanotube elements on said substrate via one of a spin coating process, a spray coating process, a dip coating process, a silk screen printing process, or a gravure printing process.

50. The method of claim 35 wherein said plurality of nanotube elements are carbon nanotubes.

51. The method of claim 35 wherein said plurality of nanotube elements are single walled nanotubes.

52. The method of claim 35 wherein said plurality of nanotube elements are multi walled nanotubes.

53. The melhod of claim 1 wherein said step of functionalizing increases the density of switching sites within at least a portion of said nanotube fabric layer.

54. The method of claim 35 wherein said step of functionalizing increases the density of switching sites within at least a portion of said nanotube fabric layer.

* * * * *